(12) United States Patent
Lee

(10) Patent No.: US 10,733,349 B2
(45) Date of Patent: Aug. 4, 2020

(54) ELECTRONIC DEVICE AND METHOD FOR FABRICATING SEMICONDUCTOR CHIP

(71) Applicant: Samsung Electronics Co., Ltd., Suwon-si, Gyeonggi-do (KR)

(72) Inventor: TaeHee Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/136,497

(22) Filed: Sep. 20, 2018

(65) Prior Publication Data

US 2019/0251222 A1 Aug. 15, 2019

(30) Foreign Application Priority Data

Feb. 14, 2018 (KR) .................. 10-2018-0018105

(51) Int. Cl.
*G06F 30/30* (2020.01)
*G06F 30/392* (2020.01)
*G06F 30/34* (2020.01)
*G06F 30/394* (2020.01)

(52) U.S. Cl.
CPC ............ *G06F 30/392* (2020.01); *G06F 30/34* (2020.01); *G06F 30/394* (2020.01)

(58) Field of Classification Search
CPC ............ G06F 17/5072; G06F 17/5054; G06F 17/5077; G06F 30/392; G06F 30/34; G06F 30/394
See application file for complete search history.

(56) References Cited

U.S. PATENT DOCUMENTS

| | | | |
|---|---|---|---|
| 6,286,128 B1 | 9/2001 | Pileggi et al. | |
| 7,225,116 B2 | 5/2007 | Harn | |
| 7,318,210 B1 | 1/2008 | Singh et al. | |
| 7,373,615 B2 | 5/2008 | Dougherty, Jr. et al. | |
| 7,620,925 B1 | 11/2009 | Manohararajah et al. | |
| 7,930,668 B1 | 4/2011 | Parsa | |
| 8,001,514 B2 | 8/2011 | Chang et al. | |
| 8,782,584 B2 | 7/2014 | Alpert et al. | |
| 2010/0115484 A1* | 5/2010 | Frederick ............ | G06F 17/5072 716/119 |
| 2011/0084312 A1* | 4/2011 | Quandt ............... | H01L 27/0207 257/202 |
| 2012/0241986 A1* | 9/2012 | Sherlekar ............ | H01L 27/0207 257/784 |
| 2014/0167117 A1* | 6/2014 | Quandt ............... | H01L 27/0207 257/202 |
| 2016/0172375 A1* | 6/2016 | Quandt ............... | H01L 27/0207 257/208 |
| 2017/0104004 A1* | 4/2017 | Quandt ............... | H01L 27/0207 |
| 2017/0344686 A1* | 11/2017 | Chang ................. | G06F 17/5072 |
| 2017/0371994 A1* | 12/2017 | Bowers ............... | G06F 17/5072 |
| 2018/0330034 A1* | 11/2018 | Lin ...................... | G06F 17/5072 |
| 2019/0130061 A1* | 5/2019 | Tsai ..................... | G06F 17/5072 |
| 2019/0138682 A1* | 5/2019 | Correale, Jr. ........ | G06F 17/5077 |

\* cited by examiner

*Primary Examiner* — Stacy Whitmore
(74) *Attorney, Agent, or Firm* — Harness, Dickey and Piercce, P.L.C.

(57) ABSTRACT

A method for fabricating a semiconductor chip includes placing, at a processor, a target cell to be used for a design of the semiconductor chip depending on a first placement, changing, at the processor, the first placement to a second placement, based on a result of comparing a cost function value of the target cell in the first placement with a reference value, and fabricating the semiconductor chip based on one of the first placement and the second placement.

20 Claims, 18 Drawing Sheets

FIG. 4
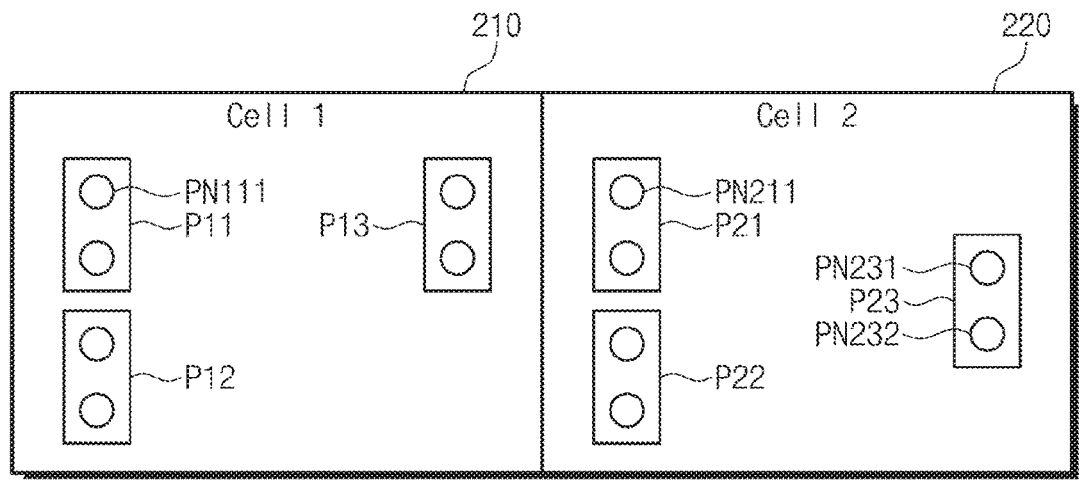
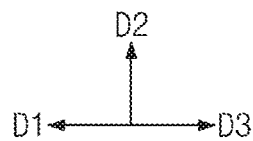
FIG. 5
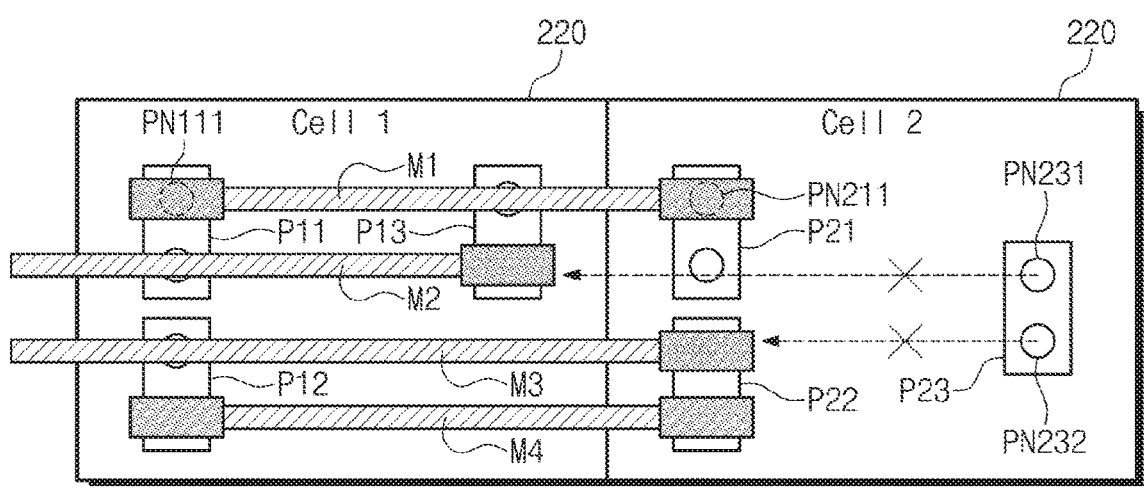
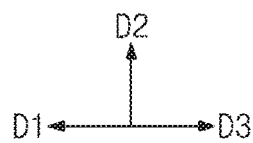

ELECTRONIC DEVICE AND METHOD FOR FABRICATING SEMICONDUCTOR CHIP

CROSS-REFERENCE TO RELATED APPLICATIONS

This application claims priority under 35 U.S.C. § 119 to Korean Patent Application No. 10-2018-0018105 filed on Feb. 14, 2018, in the Korean Intellectual Property Office, the disclosure of which is incorporated by reference herein in its entireties.

BACKGROUND

Example embodiments of the inventive concepts described herein relate to a method for fabricating a semiconductor chip and/or an electronic device configured to perform the same. For example, at least some example embodiments relate to an electronic device and/or a method which design a semiconductor chip for the purpose of fabricating the semiconductor chip.

A semiconductor chip may be designed to fabricate the semiconductor chip. Upon designing the semiconductor chip, placement and routing (P&R) is important to fabricate the semiconductor chip which is placed in the small area. The P&R may be performed using software such as an electronic design automation (EDA) vendor tool.

The placement includes placing cells to be used to design a semiconductor chip in a space on the software. A user may place cells in consideration of ports to be included in the cells and pins to be included in the ports. The routing includes connecting the cells placed in the placement. In the case where the placement is not efficiently performed, an issue that cells are not routed may occur. In the case where the placement does not satisfy a certain design rule, a problem may occur in operations following the P&R step.

When the routing is performed after the placement of the cells in the space on the software, the routing may be performed on the inefficiently placed cells. The inefficient placement of cells detected in the routing may cause a decrease in efficiency of the semiconductor design process.

SUMMARY

Example embodiments of the inventive concepts provide an electronic device and/or a method for changing the placement of cells before routing the cells to be used to design a semiconductor chip upon fabricating the semiconductor chip.

At least some example embodiments are directed to an electronic device configured to fabricate a semiconductor chip.

In some example embodiments, the electronic device may include a processor configured to, place a first target cell associated with designing the semiconductor chip; selectively flip the first target cell to reverse a placement of the first target cell to generate a reversed placement based on a first cost function value of the placement of the first target cell and a first reference value; selectively return the reversed placement of the first target cell based on a second cost function value of the reversed placement of the first target cell and the first cost function value; selectively insert a space between the first target cell and a cell adjacent to the first target cell based on one of the first cost function value and the second cost function value, and a second reference value; and selectively replace the first target cell with a second target cell associated with designing the semiconductor chip based on an occurrence of a line end spacing violation; and an input device configured to receive an input of the first reference value and the second reference value.

At least some example embodiments may be directed to a method of fabricating a semiconductor chip.

In some example embodiments, the method may include placing, by a processor, a target cell based on a first placement, the target cell being associated with designing the semiconductor chip; selectively changing, by the processor, the first placement to a second placement, based on a cost function value of the target cell in the first placement and a reference value; selectively changing, by the processor, the second placement to a third placement based on an occurrence of a line end spacing violation; and fabricating the semiconductor chip based on one of the first placement, the second placement, and the third placement.

In some other example embodiments, the method may include placing, by a processor, a target cell associated with designing the semiconductor chip; selectively flipping, by the processor, the target cell to reverse a placement of the target cell based on a first cost function value of the target cell and a first reference value; selectively inserting, by the processor, a space between the target cell and a cell adjacent to the target cell based on a second cost function value of the target cell and a second reference value; selectively replacing, by the processor, the target cell with another cell, based on an occurrence of a line end spacing violation; repeating, by the processor, at least one of the selectively flipping, the selectively inserting, and the selectively replacing based on a third cost function value of the target cell and a third reference value; and fabricating the semiconductor chip based on the target cell.

BRIEF DESCRIPTION OF THE DRAWINGS

The above and other objects and features of the inventive concepts will become apparent by describing in detail example embodiments thereof with reference to the accompanying drawings.

FIG. 4 is a conceptual diagram illustrating example cells placed according to an operation of FIG. 3.

FIG. 5 is a conceptual diagram illustrating example cells routed according to an operation of FIG. 3.

DETAILED DESCRIPTION

Below, some example embodiments of the inventive concepts may be described in detail and clearly to such an extent that an ordinary one in the art easily implements the inventive concepts.

The term "cell" is used in the specification. Below, a cell may mean a unit block which is configured to perform one function, on software for designing a semiconductor chip. For example, the cell may include a logic gate block for performing a logical operation, etc. The term "port" is used in the specification. Below, the port may mean a component of a cell for inputting and outputting a signal between cells. The term "pin" is used in the specification. Below, the pin may mean a component of a port for connecting ports. For example, one port may include one or more pins.

The term "routing" is used in the specification. Below, the routing may mean connecting pins to each other on software for the purpose of designing a semiconductor chip depending on a command of a user. However, in the specification, "connection" may mean allowing components used to design a semiconductor chip to correspond to each other on software, rather than meaning a physical contact. Below, in the specification, that ports are routed may mean that pins included in the ports are connected to each other, depending on a command of a user, on software. Below, in the specification, that cells are routed may mean that ports included in the cells are routed to each other, depending on a command of the user, on software.

Figure 1:
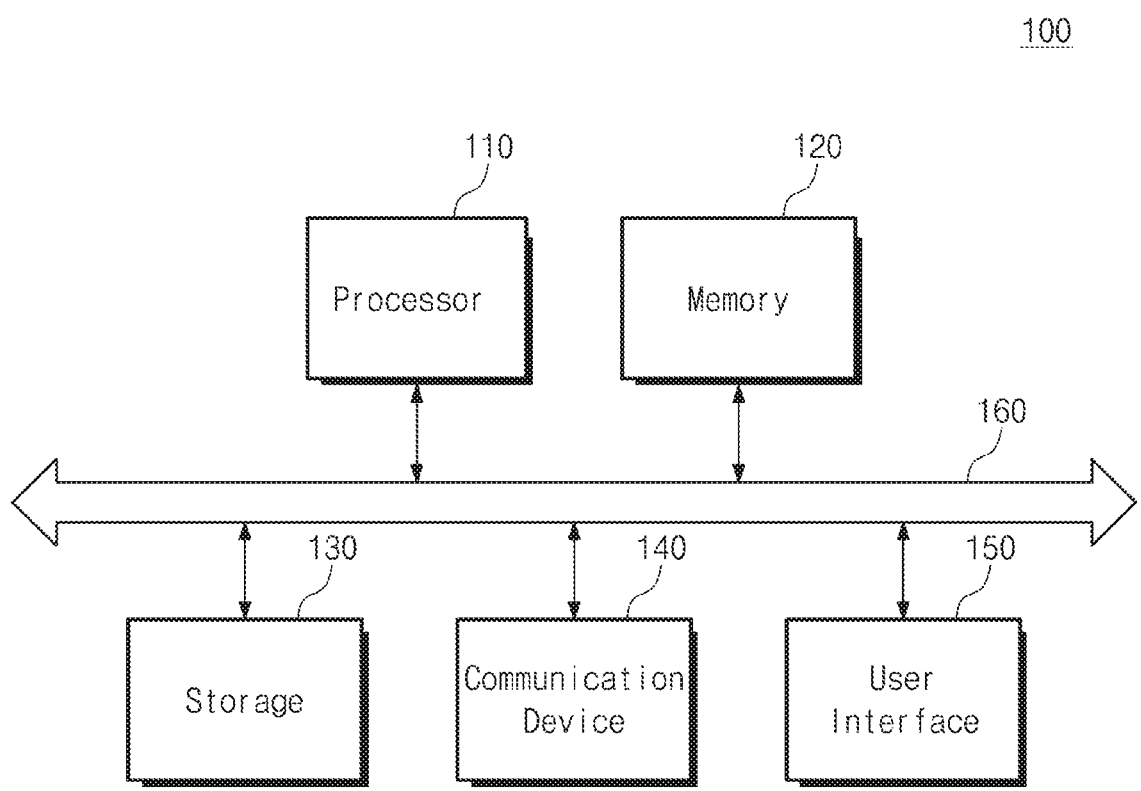
FIG. 1 is a block diagram illustrating an electronic device for designing a semiconductor chip, according to an example embodiment of the inventive concepts.

FIG. 1 is a block diagram illustrating an electronic device for designing a semiconductor chip, according to an example embodiment of the inventive concepts.

Referring to FIG. 1, an electronic device 100 may be one of a personal computer (PC), a workstation, a laptop computer, a mobile device, etc. Referring to FIG. 1, the electronic device 100 may include a processor 110, a memory 120, storage 130, a communication device 140, a user interface 150, and a bus 160. The electronic device 100 may further include other components (e.g., various sensors and a power supply) which are not illustrated in FIG. 1. Alternatively, the electronic device 100 may not include one or more of components which are illustrated in FIG. 1.

The processor 110 may control overall operations of the electronic device 100. For example, the processor 110 may execute computer readable code (e.g., software), that when executed transforms the processor 110 into a special purpose computer configured to design a semiconductor chip. For example, the processor 110 may execute an electronic design automation (EDA) vendor tool. The processor 110 may perform operations for designing a semiconductor chip. The processor 110 may generate design information to be used to fabricate a semiconductor chip, based on a command of the user received through the user interface 150. Example embodiments of designing a semiconductor chip will be described with reference to FIGS. 2 to 19.

For example, the processor 110 may be one of a workstation processor, an application processor, and the like. The processor 110 may include a single processor core or may include a plurality of processor cores. For example, the processor 110 may include a multi-core such as a dual-core, a quad-core, a hexa-core, or the like.

The memory 120 may store data processed or to be processed by the processor 110. For example, the memory 120 may store data which are used for designing a semiconductor chip. The memory 120 may store data associated with a semiconductor chip designed by the processor 110. For example, the memory 120 may store commands of the user received through the user interface 150. For example, the memory 120 may store data to be used for fabricating a semiconductor chip (refer to FIG. 2).

For example, the memory 120 may include a volatile memory such as a static random access memory (SRAM), a dynamic RAM (DRAM), a synchronous DRAM (SDRAM), etc. or a nonvolatile memory such as a flash memory, a phase-change RAM (PRAM), a magneto-resistive RAM (MRAM), a resistive RAM (ReRAM), a ferroelectric RAM (FRAM), etc. Alternatively, the memory 120 may include heterogeneous memories.

The storage 130 may store data regardless of power supply. For example, the storage 130 may store data which are used for designing a semiconductor chip. The storage 130 may store data associated with a semiconductor chip designed by the processor 110. For example, the storage 130 may store design information (refer to FIG. 2). For example, the storage 130 may be a storage medium, which includes a nonvolatile memory, such as a hard disk drive (HDD), a solid state drive (SSD), a secure digital (SD) card, a universal serial bus (USB) memory device, etc.

The communication device 140 may include a transmitter and/or a receiver. The electronic device 100 may communicate with another electronic device through the communication device 140 to transmit and/or receive data.

The user interface 150 may transfer a command or an input/output of data between the user and the electronic device 100. For example, the user interface 150 may include a physical device such as an input device and/or an output device. The input device may include a keyboard, a mouse, a touchscreen, a scanner, a joystick, a voice recognition device, a motion recognition device, or an eyeball recognition device, and the output device may include a monitor, a display device, a projector, a speaker, or a plotter.

For example, the user may input commands for designing a semiconductor chip through the user interface 150. The electronic device 100 may obtain data to be used to design a semiconductor chip from the input command(s) of the user. For example, the electronic device 100 may provide information about a semiconductor design to the user through the user interface 150. Examples of commands and data exchanged between the user and the electronic device 100 through the user interface 150 will be described with reference to FIG. 2.

The bus 160 may provide a communication path between components of the electronic device 100. For example, the processor 110, the memory 120, the storage 130, the communication device 140, and the user interface 150 may exchange data with one another through the bus 160. For example, the processor 110 and the memory 120 may exchange data, which are used for designing a semiconductor chip, through the bus 160. The bus 160 may be configured to support various types of communication formats used in the electronic device 100.

Figure 2:
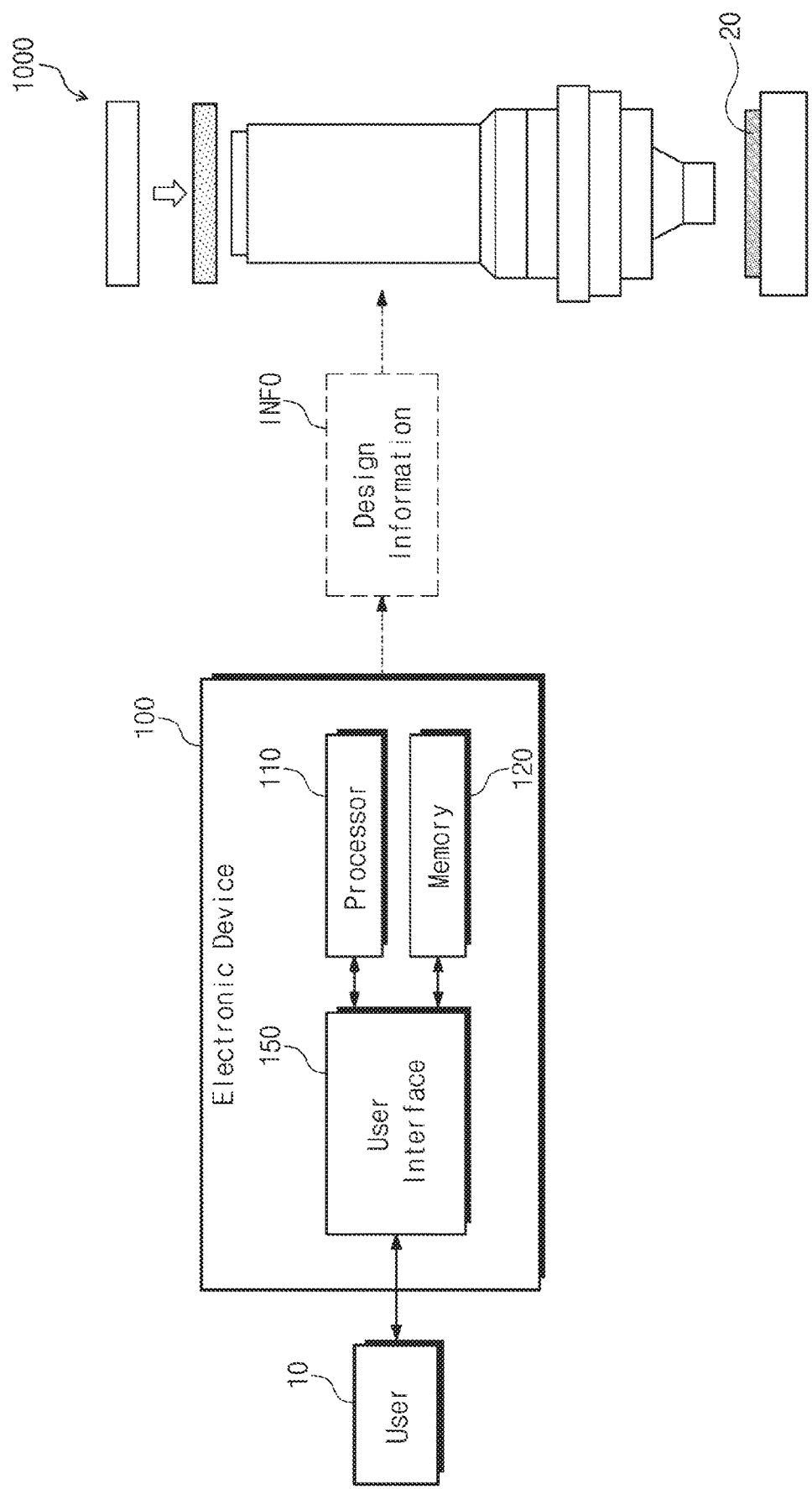
FIG. 2 is a conceptual diagram illustrating a method for designing a semiconductor chip by using a semiconductor manufacturing device and an electronic device of FIG. 1, according to an example embodiment of the inventive concept.

FIG. 2 is a conceptual diagram illustrating a method for designing a semiconductor chip by using a semiconductor manufacturing device and an electronic device of FIG. 1, according to an example embodiment of the inventive concepts.

Referring to FIG. 2, a user 10 may input a command to the electronic device 100 through the user interface 150 for the purpose of designing a semiconductor chip. The electronic device 100 may execute software for designing a semiconductor chip. A semiconductor chip may be designed on software executed by the electronic device 100, depending on the command of the user 10. The electronic device 100 may generate design information INFO to be used to fabricate the semiconductor chip based on the designed semiconductor chip.

For example, the electronic device 100 may place one or more cells to be included in the semiconductor chip on the software, based on the command of the user 10. The placement of the cells may be changed by using specific methods, depending on the command of the user 10. Examples of placing cells and example methods for changing the placement of cells will be described with reference to FIGS. 3 to 19. The cells may be routed depending on the command of the user 10. The processor 110 may generate the design information INFO to be used to fabricate the semiconductor chip, based on the routed cells.

The memory 120 may store data which are used for designing the semiconductor chip. For example, the memory 120 may store a library of cells to be included in the semiconductor chip. The memory 120 may store data associated with the designed semiconductor chip. For example, the memory 120 may store information about the command of the user 10 received through the user interface 150. For example, the memory 120 may store data indicating the design information INFO generated by the processor 110. For example, the memory 120 may store reference values which are used to place cells to be included in a semiconductor chip (refer to FIGS. 15, 18, and 19).

The user 10 may input values to be used to design a semiconductor chip through the user interface 150. For example, the user interface 150 may include an input device. The user 10 may input the reference values which are used to place cells to be included in a semiconductor chip (refer to FIGS. 15, 18, and 19).

The processor 110 and the memory 120 may provide information about a semiconductor chip to the user 10 through the user interface 150. For example, the user interface 150 may include an output device such as a display device. The processor 110 and the memory 120 may provide image information about a layout of a semiconductor chip through the output device such as a display.

A semiconductor manufacturing device 1000 may fabricate a semiconductor chip on a wafer 20, based on the design information INFO generated by the electronic device 100. For example, a semiconductor chip may include physical components corresponding to cells designed by the electronic device 100.

Figure 3:
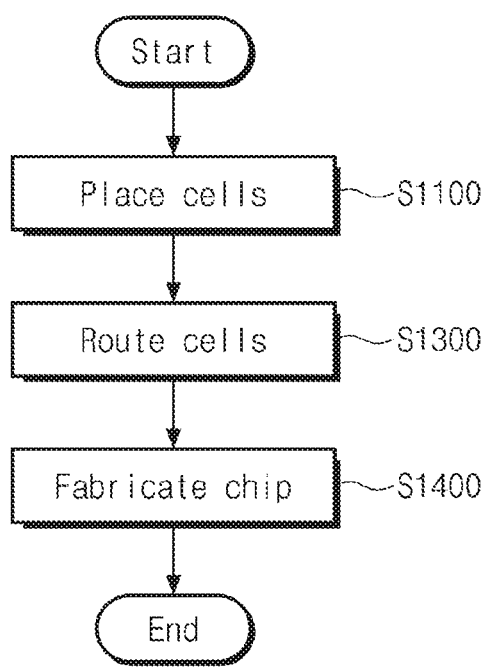
FIG. 3 is a flowchart illustrating an example method for fabricating a semiconductor chip, by using an electronic device and a semiconductor manufacturing device of FIG. 2.

FIG. 3 is a flowchart illustrating an example method for fabricating a semiconductor chip, by using an electronic device and a semiconductor manufacturing device of FIG. 2.

An example method for fabricating a semiconductor chip will be described with reference to FIGS. 2 and 3.

Referring to FIGS. 2 and 3, before operation S1100 is performed, the electronic device 100 may obtain information to be used for operation S1100 and operation S1300, from a command of the user 10. For example, the electronic device 100 may obtain information about the placement of cells. For example, the electronic device 100 may obtain information about the routing of the cells.

In operation S1100, the electronic device 100 may place cells to be included in the semiconductor chip based on the information obtained before operation S1100. For example, the electronic device 100 may store a cell library in the memory 120. The cells stored in the cell library may be placed according to the command of the user 10.

In operation S1300, the electronic device 100 may route the cells placed in operation S1100 based on the information obtained before operation S1100. For example, the cells may be routed by metal lines. However, in the specification, a metal line may mean a component for connecting ports of the cells, on software, rather than meaning a physical component. As described with reference to FIG. 2, the electronic device 100 may generate design information to be used to fabricate the semiconductor chip, based on the placed and routed cells.

In operation S1400, the electronic device 100 may instruct the semiconductor manufacturing device 1000 to fabricate the semiconductor chip on a wafer, based on the design information. For example, the semiconductor manufacturing device 1000 may fabricate a semiconductor chip based on the cells placed in operation S1100 and routed in operation S1300.

The example method is illustrated in FIG. 3 as including operation S1100, operation S1300, and operation S1400, but the inventive concepts may further include any other operations not illustrated in FIG. 3. For example, a clock tree synthesis (CTS) operation may be performed between operation S1300 and operation S1400. Alternatively, as will be described with reference to FIG. 6, an operation for changing the placement of cells may be performed between operation S1100 and operation S1300.

FIG. 4 is a conceptual diagram illustrating example cells placed according to an operation of FIG. 3.

Referring to FIG. 4, a placement 200 may include a first cell 210 and a second cell 220. The first cell 210 and the second cell 220 may be placed to be adjacent to each other. The first cell 210 may include a port P11, a port P12, and a port P13. The second cell 220 may include a port P21, a port P22, and a port P23.

Each of the ports P11 to P13 and P21 to P23 may include two pins respectively. For example, the port P11 may include a pin PN111. The port P21 may include a pin PN211. The port P23 may include a pin PN231 and a pin PN232. Below, the ports P11 to P13 and P21 to P23 each including two pins will be described. However, each of the ports P11 to P13 and P21 to P23 may include one or more pins.

As described with reference to FIG. 2, the ports P11 to P13 and the ports P21 to P23 may be routed based on a command received from the user 10. Below, an example method for routing the ports P11 to P13 and the ports P21 to P23 will be described with reference to FIG. 5.

FIG. 5 is a conceptual diagram illustrating example cells routed according to an operation of FIG. 3.

The ports P11 to P13 and the ports P21 to P23 may be routed in horizontal directions D1 and D3 or a vertical direction D2 on one layer. Below, an example method for routing the ports P11 to P13 and the ports P21 to P23 in the horizontal directions D1 and D3 on one layer will be described with reference to FIG. 5.

Referring to FIG. 5, the port P11 may be routed with the port P21 by a metal line M1 through the pin PN111 and the pin PN211. As in the above description, the ports P12 and P13 and the ports P22 and P23 may be routed by metal lines through corresponding pins. For example, the port P13 may be routed in the direction D1 by a metal line M2. The port P22 may be routed in the direction D1 by a metal line M3. The port P22 may be routed with the port P12 by a metal line M4.

Before operation S1100 of FIG. 3, the electronic device 100 may receive a command for connecting the port P23 in the direction D1, from the user 10. However, in FIG. 5, the port P23 cannot be connected in the direction D1 due to the previously placed metal lines M2 and M3. For example, the direction D1 facing away from the pin PN231 may be blocked by the metal line M2. The direction D1 facing away from the pin PN232 may be blocked by the metal line M3. Accordingly, routing the port P23 in the direction D1 may be impossible.

Figure 6:
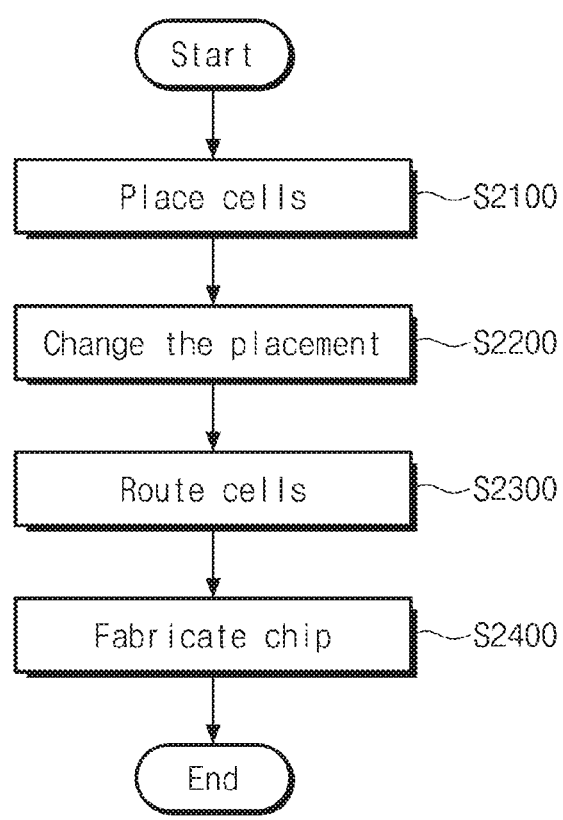
FIG. 6 is a flowchart illustrating an example method for fabricating a semiconductor chip, by using an electronic device and a semiconductor manufacturing device of FIG. 2.

FIG. 6 is a flowchart illustrating an example method for fabricating a semiconductor chip, by using an electronic device and a semiconductor manufacturing device of FIG. 2.

Referring to FIGS. 2 and 6, before operation S2100 is performed, the electronic device 100 may obtain information to be used for operation S2100 to operation S2300, from a command of the user 10. For example, the electronic device 100 may obtain information about the placement of cells. For example, the electronic device 100 may obtain information about the routing of the cells.

A method of FIG. 6 may further include operation S2200 in addition to the method described with reference to FIG. 3. Operation S2200 may be performed between operation S2100 and operation S2300. Operation S2100 is similar to operation S1100, operation S2300 is similar to operation S1300, and operation S2400 is similar to operation S1400. Thus, additional description will be omitted to avoid redundancy.

In operation S2200, the electronic device 100 may change the placement of the cells placed in operation S2100 according to a command of a user. That is, the placement made in operation S2100 may be changed according to the command of the user. The electronic device 100 may change the placement of the cells in various manners. For example, the electronic device 100 may perform one or more operations of flipping a cell placed in operation S2100, inserting a space between cells placed in operation S2100, and replacing a cell placed in operation S2100.

Below, example embodiments of changing the placement made in operation S2100 to increase the routability will be described with reference to FIGS. 7 to 14. However, it may be understood that a method for changing the placement of a cell may be variously changed or modified without a limitation to the following example embodiments.

Below, in the specification, the "routability" may be defined with respect to a specific placement, and may mean the possibility associated with whether the routing of cells included in the specific placement is possible. The term "flipping" is used in the specification. Below, the flipping may mean reversing the placement of a specific cell in a horizontal direction (e.g., the direction D1 and/or the direction D3 of FIGS. 4 and 5).

Figure 7:
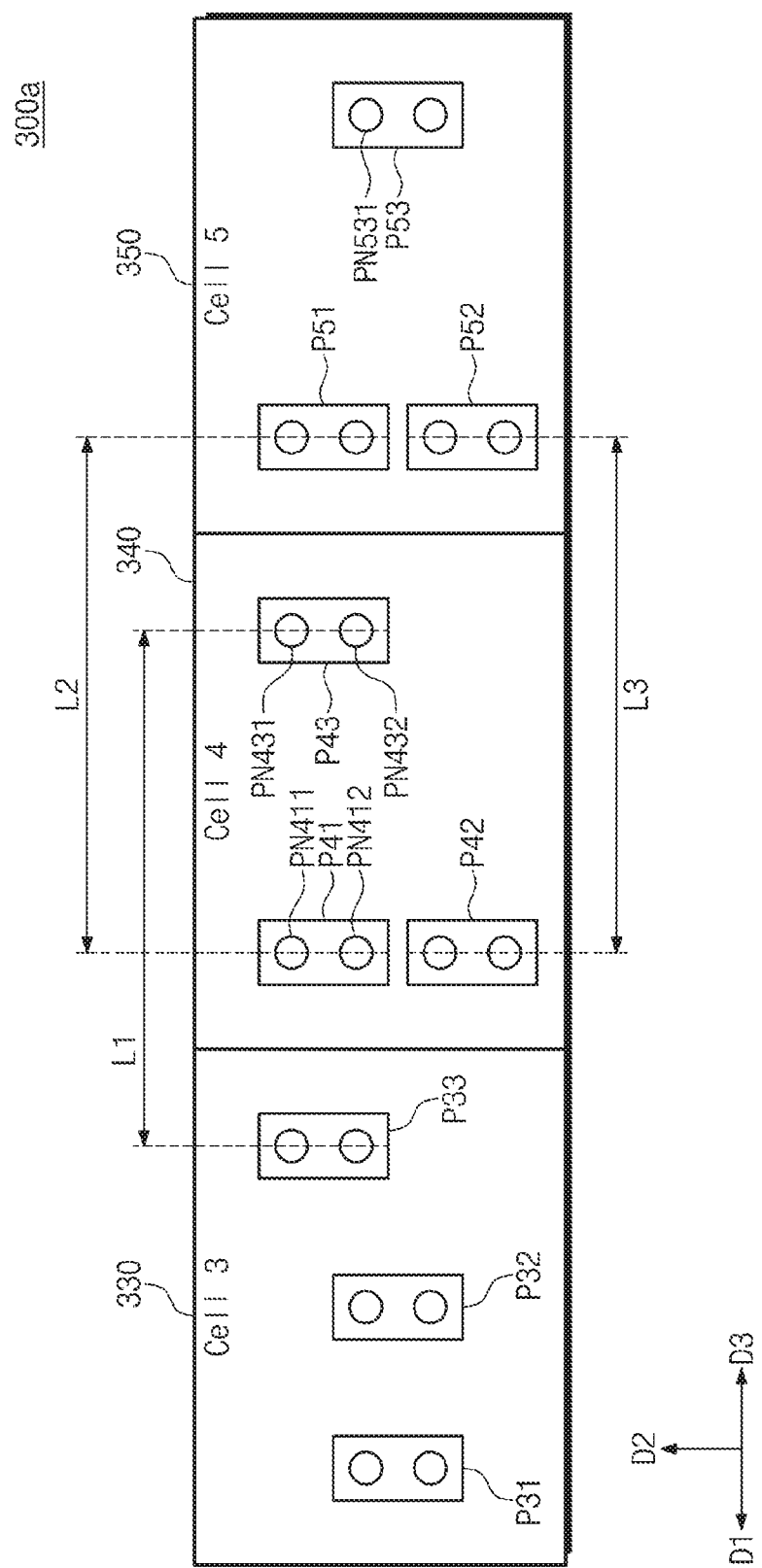
FIG. 7 is a conceptual diagram illustrating example cells placed according to an operation of FIG. 6.

FIG. 7 is a conceptual diagram illustrating example cells placed according to an operation of FIG. 6.

Referring to FIG. 7, a placement 300a may include a third cell 330, a fourth cell 340, and a fifth cell 350. The third cell 330 and the fourth cell 340 may be placed adjacent to each other. The fourth cell 340 and the fifth cell 350 may be placed adjacent to each other. The third cell 330 may include a port P31, a port P32, and a port P33. The fourth cell 340 may include a port P41, a port P42, and a port P43. The fifth cell 350 may include a port P51, a port P52, and a port P53. The port P53 may include a pin PN531.

Below, for better understanding, the ports P31 to P33, P41 to P43, and P51 to P53 each including two pins will be described. However, each of the ports P31 to P33, P41 to P43, and P51 to P53 may include one or more pins.

The placements of the fourth cell 340 and the fifth cell 350 of FIG. 7 may be substantially identical to the placements of the first cell 210 and the second cell 220, respectively, of FIGS. 4 and 5. Accordingly, the ports P41 to P43 of the fourth cell 340 may correspond to the ports P11 to P13 of the first cell 210, respectively. The ports P51 to P53 of the fifth cell 350 may correspond to the ports P21 to P23 of the second cell 220, respectively.

As described with reference to FIG. 5, in operation S1300 of FIG. 3, the port P23 cannot be routed in the direction D1. As in the above description, in FIG. 7, the port P53 cannot be routed in the direction D1. For example, the port P53 cannot be routed in the direction D1 through the pin PN531.

In operation S2200 performed before operation S2300, the electronic device 100 of FIG. 1 may change the placements of the third to fifth cells 330 to 350 based on a cost function and whether a line end spacing violation occurs, such that all ports of the placement 300a may be routed. A line end spacing violation will be more fully described with reference to FIG. 12. Example methods for changing the placement 300a will be described with reference to FIGS. 8 to 14. A cost function and a cost function value to be used in the example method for changing the placement 300a will be described below.

The electronic device 100 may calculate the cost function value depending on the cost function with respect to each of the cells 330 to 350. With regard to a specific cell, the cost function value may be associated with whether all routing of the specific cell is possible.

With regard to a specific pin included in a placement, the cost function may be associated with the number "B" of pins located on a routing path between the specific pin and a pin to be connected to the specific pin. Alternatively, the cost function may be associated with a distance "L" between cells included in a placement. Below, the cost function expressed by using "B" will be described with reference to Equation 1.

$$\sum_{port \in A(port)} \left( \frac{1}{N(\text{pin}) - N(\text{connected})} \sum_{pin \in A(pin)} B \right) \quad \text{[Equation 1]}$$

In Equation 1, "A(port)" may mean a set of ports included in one cell. "N(pin)" may mean the number of pins included in one port. "N(connected)" may mean the number of pins, which will be connected with any other pin, from among pins included in one port. "A(pin)" may mean a set of all pins included in one port. "B" may mean the number of pins located on a routing path associated with one pin, in operation S2300 of FIG. 6. Below, Equation 1 will be more fully described with reference to the fourth cell 340.

The fourth cell 340 may include three ports P41 to P43. Each of the three ports P41 to P43 may include two pins. Accordingly, "N(pin)" of each of the ports P41 to P43 may be "2".

As described with reference to FIG. 6, before operation S2100 is performed, the electronic device 100 may obtain information about routing of the ports P41 to P43 from a command of a user. The information about the routing of the ports P41 to P43 may be associated with which ports are routed with the ports P41 to P43.

For example, according to the information obtained from the command of the user, in the fourth cell 340, the port P41 may be routed with the port P51, the port P42 may be routed with the port P52, and the port P43 may be routed with the port P53. That is, each of the ports P41 to P43 of the fourth cell 340 may be routed with one different port. Accordingly, with regard to the ports P41 to P43, one pin, which will be connected with any other pin, from among pins included in one port may exist. Accordingly, "N(connected)" of each of the ports P41 to P43 may be "1". Accordingly, $$\frac{1}{N(\text{pin}) - N(\text{connected})}$$

associated with each of the ports P41 to P43 may be "1".

"B" may mean the number of pins located on a routing path associated with a specific pin and any other pin to be connected to the specific pin. For example, referring to FIG. 7, the pin PN411 may be located on a routing path of the pin PN431. Accordingly, "B" of the pin PN431 may be "1". The pin PN412 may be located on a routing path of the pin PN432. Accordingly, "B" of the pin PN432 may be "1". The pin PN431 may be located on a routing path of the pin PN411. Accordingly, "B" of the pin PN411 may be "1". The pin PN432 may be located on a routing path of the pin PN412. Accordingly, "B" of the pin PN412 may be "1". A pin may be absent from a routing path of pins included in the port P42. Accordingly, "B" of each pin included in the port P42 may be "0".

Accordingly, a sum (i.e., $\Sigma \text{pin} \in A(\text{pin})^B$) of pieces of "B" associated with "A(pin)" of each of the pins P41 to P43 may be "1". A sum of $$\frac{1}{N(\text{pin}) - N(\text{connected})} \sum\nolimits_{\text{pin} \in A(\text{pin})} B$$

associated with "A(port)" of all the ports P41 to P43 of the fourth cell 340, that is, a value of the fourth cell 340 calculated according to Equation 1(a cost function value) may be "3". As in the method described above with reference to FIG. 7, the electronic device 100 may calculate the cost function value of each of the third cell 330 and the fifth cell 350.

Below, the cost function expressed by using "L" will be described with reference to Equation 2.

$$\sum\nolimits_{\text{port} \in A(\text{port})} \left( \frac{1}{N(\text{pin}) - N(\text{connected})} \sum\nolimits_{\text{pin} \in A(\text{pin})} \frac{1}{L} \right) \quad [\text{Equation 2}]$$

In Equation 2, "A(port)" may mean a set of ports included in one cell. "N(pin)" may mean the number of pins included in one port. "N(connected)" may mean the number of pins, which will be connected with any other pin, from among pins included in one port. "A(pin)" may mean a set of all pins included in one port. "L" may mean a distance between one pin and any other pin to be connected to the pin, in operation S2300 of FIG. 6. Below, Equation 2 will be more fully described with reference to the fourth cell 340.

A distance between a first pin of the port P41 and a pin of the port P51 to be connected to the first pin of the port P41 may be "L2". A distance between a second pin of the port P42 and a pin of the port P52 to be connected to the second pin of the port P42 may be "L3". A distance between a third pin of the port P43 and a pin of the port P33 to be connected to the third pin of the port P43 may be "L1". Accordingly, "L" associated with the first pin of the port P41 may be "L2", "L" associated with the second pin of the port P42 may be "L3", and "L" associated with the third pin of the port P43 may be "L1".

Accordingly, a sum of pieces of "1/L"

$$\left( \text{i.e.,} \sum\nolimits_{\text{pin} \in A(\text{pin})} \frac{1}{L} \right)$$

associated with "A(pin)" including all pins of the port P41 may be "1/L2". As in the above description, a sum of pieces of "1/L" associated with "A(pin)" including all pins of the port P42 may be "1/L3", and a sum of pieces of "1/L" associated with "A(pin)" including all pins of the port P43 may be "1/L1".

A sum of $$\frac{1}{N(\text{pin}) - N(\text{connected})} \sum\nolimits_{\text{pin} \in A(\text{pin})} \frac{1}{L}$$

associated with "A(port)" including all ports P41 to P43 of the fourth cell 340, that is, a value of the fourth cell 340 calculated according to Equation 2 (a cost function value) may be "1/L1+1/L2+1/L3".

As in the method described above with reference to FIG. 7, the electronic device 100 may calculate the cost function value of each of the third cell 330 and the fifth cell 350. Below, for convenience of description, a cost function according to Equation 2 will be described. However, it may be understood that an equation of a cost function for obtaining a cost function value may be variously changed or modified without a limitation to examples of Equation 1 and Equation 2. Below, a method for changing the placement 300a and calculating a cost function value associated with a cell of the changed placement will be described with reference to FIG. 8.

Figure 8:
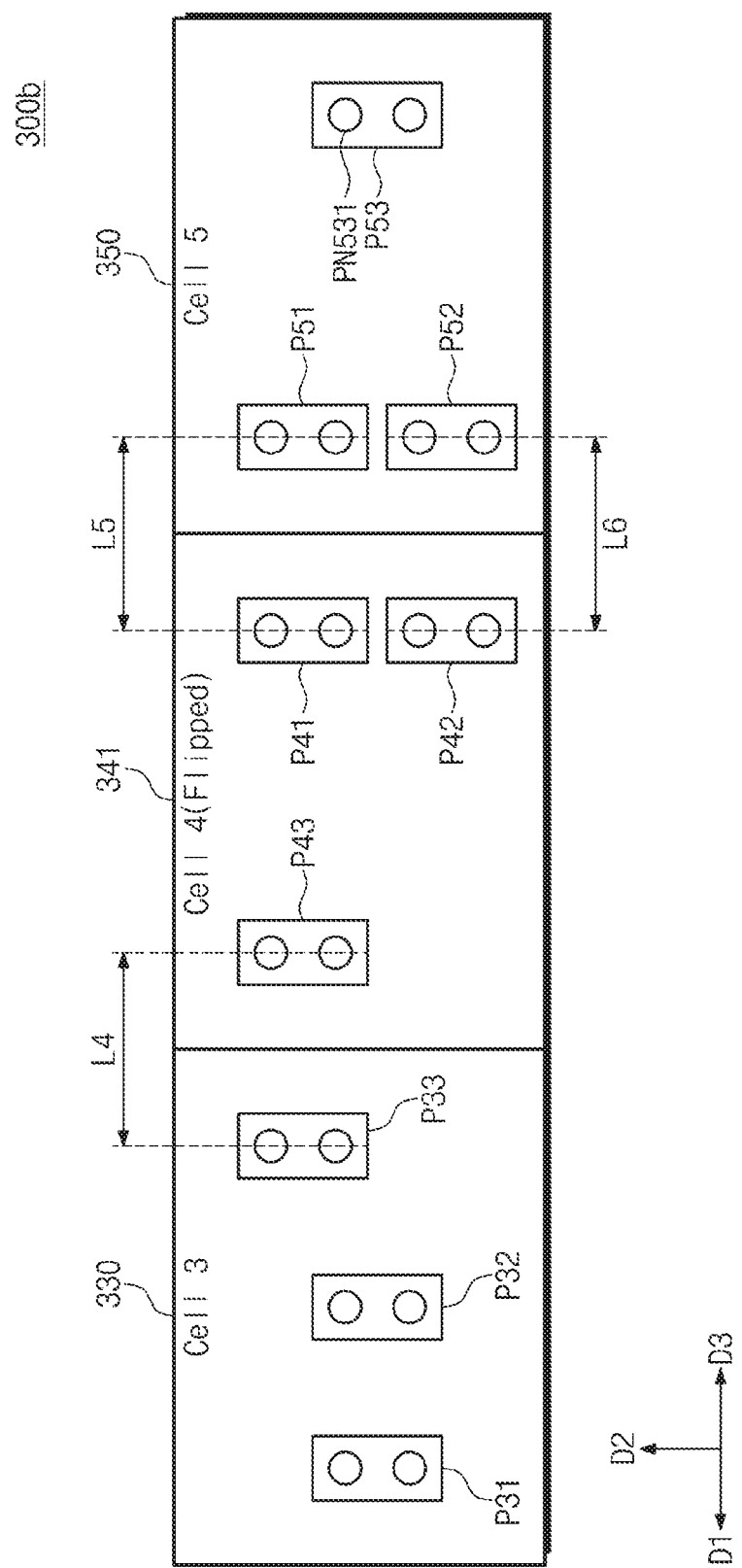
FIG. 8 is a conceptual diagram illustrating example cells having a placement changed according to an operation of FIG. 6.

FIG. 8 is a conceptual diagram illustrating example cells having a placement changed according to an operation of FIG. 6.

Compared to FIG. 7, a placement 300b may include a fourth cell 341 flipped, instead of the fourth cell 340. In operation S2200 of FIG. 6, the electronic device 100 may flip the fourth cell 340 of FIG. 7. Accordingly, the ports P41 to P43 of the flipped fourth cell 341 may correspond to the ports P41 to P43 of the fourth cell 340 of FIG. 7, respectively. Below, a method for obtaining a cost function value of the flipped fourth cell 341 of FIG. 8 depending on Equation 2 will be described.

The flipped fourth cell 341 may include the three ports P41 to P43 of the fourth cell 340 of FIG. 7. Accordingly, "N(pin)" and "N(connected)" of the flipped fourth cell 341 may be identical to "N(pin)" and "N(connected)" of the fourth cell 340 of FIG. 7, respectively.

In an example of FIG. 8, a distance between a first pin of the port P41 and a pin of the port P51 to be connected to the first pin may be "L5". A distance between a second pin of the port P42 and a pin of the port P52 to be connected to the second pin may be "L6". A distance between a third pin of the port P43 and a pin of the port P33 to be connected to the third pin may be "L4". Accordingly, "L" associated with the first pin of the port P41 may be "L5", "L" associated with the second pin of the port P42 may be "L6", and "L" associated with the third pin of the port P43 may be "L4".

Accordingly, a sum $$\left(\text{i.e., } \sum\nolimits_{pin \in A(pin)} \frac{1}{L}\right)$$

of pieces of "1/L" associated with "A(pin)" including all pins of the port P41 may be "1/L5". As in the above description, a sum of pieces of "1/L" associated with "A(pin)" including all pins of the port P42 may be "1/L6", and a sum of pieces of "1/L" associated with "A(pin)" including all pins of the port P43 may be "1/L4".

A sum of $$\frac{1}{N(\text{pin}) - N(\text{connected})} \sum\nolimits_{pin \in A(pin)} \frac{1}{L},$$

associated with "A(port)" including all the ports P41 to P43 of the flipped fourth cell 341, that is, a cost function value may be "1/L4+1/L5+1/L6".

Referring to FIGS. 7 and 8, IA may be smaller than L1, L5 may be smaller than L2, and L6 may be smaller than L3. Accordingly, the cost function value "1/L4+1/L5+1/L6" of the flipped fourth cell 341 may be greater than the cost function value "1/L1+1/L2+1/L3" of the fourth cell 340. The cost function value of the fourth cell 340 may be increased by the flipping.

"L" is described above as a distance between pins, but "L" may also mean a distance between ports. For example, "L1" may mean a distance between the port P33 and the port P43. For example, "L2" may mean a distance between the port P41 and the port P51. For example, "L3" may mean a distance between the port P42 and the port P52.

According to Equation 2, the cost function value may be associated with "L". In detail, as "L" increases, the cost function value may decrease. "L" may correspond to a length of a metal line for routing ports. Accordingly, as a length of metal lines connected in operation S2300 of FIG. 6 decreases, the cost function value may decrease.

Figure 9:
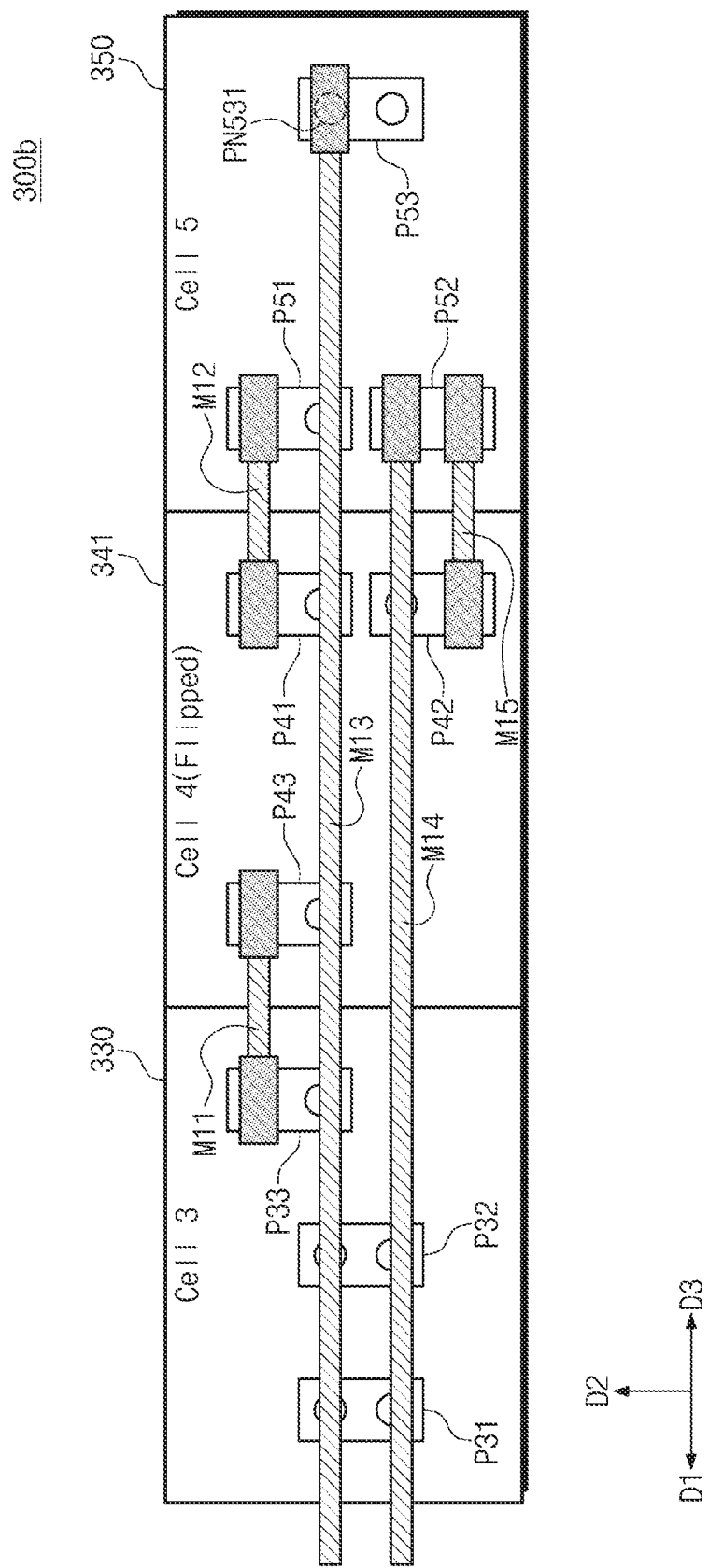
FIG. 9 is a conceptual diagram illustrating example cells routed according to an operation of FIG. 6.

FIG. 9 is a conceptual diagram illustrating example cells routed according to an operation of FIG. 6.

The ports P31 to P33, the ports P41 to P43, and the ports P51 to P53 may be routed in the horizontal directions D1 and D3 or the vertical direction D2 on one layer. Below, an example method for routing the ports P31 to P33, the ports P41 to P43, and the ports P51 to P53 in the horizontal directions D1 and D3 on one layer will be described with reference to FIG. 9.

Referring to FIG. 9, the port P53 may be routed in the direction D1 by a metal line M13, through the pin PN531. As in the above description, the ports P31 to P33, the ports P41 to P43, and the ports P51 and P52 may be routed by metal lines through corresponding pins. For example, the port P43 may be routed with the port P33 by a metal line M11. The port P41 may be routed with the port P51 by a metal line M12. The port P52 may be routed in the direction D1 by a metal line M14. The port P52 may be routed with the port P42 by the metal line M15.

As described with reference to FIGS. 7 and 8, the cost function value of the flipped fourth cell 341 may be greater than the cost function value of the fourth cell 340. In the placement 300a of FIG. 7, the port P53 cannot be routed in the direction D1. However, in the placement 300b of FIGS. 8 and 9, the port P53 may be routed in the direction D1. Accordingly, the routability of the placement 300b including the flipped fourth cell 341 may be higher than the routability of the placement 300a including the fourth cell 340.

In the operation of flipping the fourth cell 340 in operation S2300 of FIG. 6, the cost function value may be associated with the routability of the placements 300a and 300b. In detail, with regard to the operation of flipping the fourth cell 340, as the cost function value increases, the routability may increase.

The example method for flipping the fourth cell 340 for the purpose of increasing the routability is described above with reference to FIGS. 8 and 9. However, the inventive concepts are not limited thereto. For example, the inventive concepts may include all embodiments for flipping one or more cells for the purpose of increasing the routability.

Figure 10:
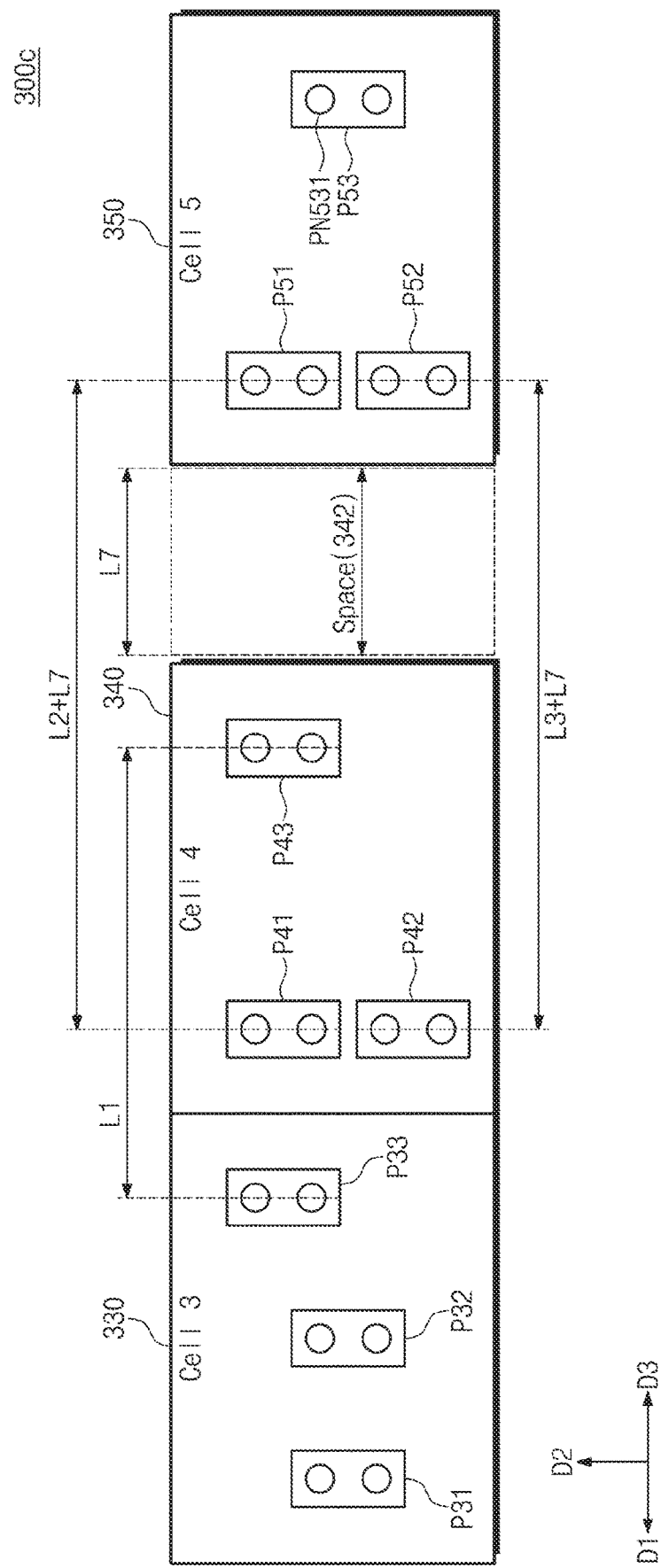
FIG. 10 is a conceptual diagram illustrating example cells having a placement changed according to an operation of FIG. 6.

FIG. 10 is a conceptual diagram illustrating example cells having a placement changed according to an operation of FIG. 6.

Below, an example method for obtaining a cost function value of the fourth cell 340 of FIG. 10 depending on Equation 2 will be described. N(pin) and N(connected) of the fourth cell 340 are described with reference to FIG. 7. Thus, additional description will be omitted to avoid redundancy.

Compared to FIG. 7, a placement 300c of FIG. 10 may further include a space 342 in the placement 300a. In operation S2200 of FIG. 6, the electronic device 100 may insert the space 342 between the fourth cell 340 and the fifth cell 350 of FIG. 7. A width of the space 342 in the directions D1 and D3 may be "L7". A distance between a first pin of the port P41 and a pin of the port P51 to be connected to the first pin may increase by "L7". A distance between a second pin of the port P42 and a pin of the port P52 to be connected to the second pin may increase by "L7". Accordingly, "L" associated with the first pin of the port P41 may be "L2+L7", "L" associated with the second pin of the port P42 may be "L3+L7", and "L" associated with the third pin of the port P43 may be "L1".

Accordingly, a sum $$\left(\text{i.e., } \sum\nolimits_{pin \in A(pin)} \frac{1}{L}\right)$$

of pieces of "1/L" associated with "A(pin)" including all pins of the port P41 may be "1/(L2+L7)". As in the above description, a sum of pieces of "1/L" associated with "A(pin)" including all pins of the port P42 may be "1/(L3+L7)", and a sum of pieces of "1/L" associated with "A(pin)" including all pins of the port P43 may be "1/L1".

A sum of $$\frac{1}{N(\text{pin}) - N(\text{connected})} \sum\nolimits_{pin \in A(pin)} \frac{1}{L}$$

associated with "A(port)" including all ports P41 to P43 of the fourth cell 340, that is, a cost function value may be "1/L1+1/(L2+L7)+1/(L3+L7)".

Referring to FIGS. 7 and 10, the cost function value "1/L1+1/(L2+L7)+1/(L3+L7)" of the fourth cell 340 of FIG. 10 may be smaller than the cost function value "1/L1+1/L2+1/L3" of the fourth cell 340 of FIG. 7. The cost function value of the fourth cell 340 may decrease by inserting the space 342 between the fourth cell 340 and the fifth cell 350. As described with reference to FIG. 7, the cost function value may be associated with the routability of a specific placement.

Figure 11:
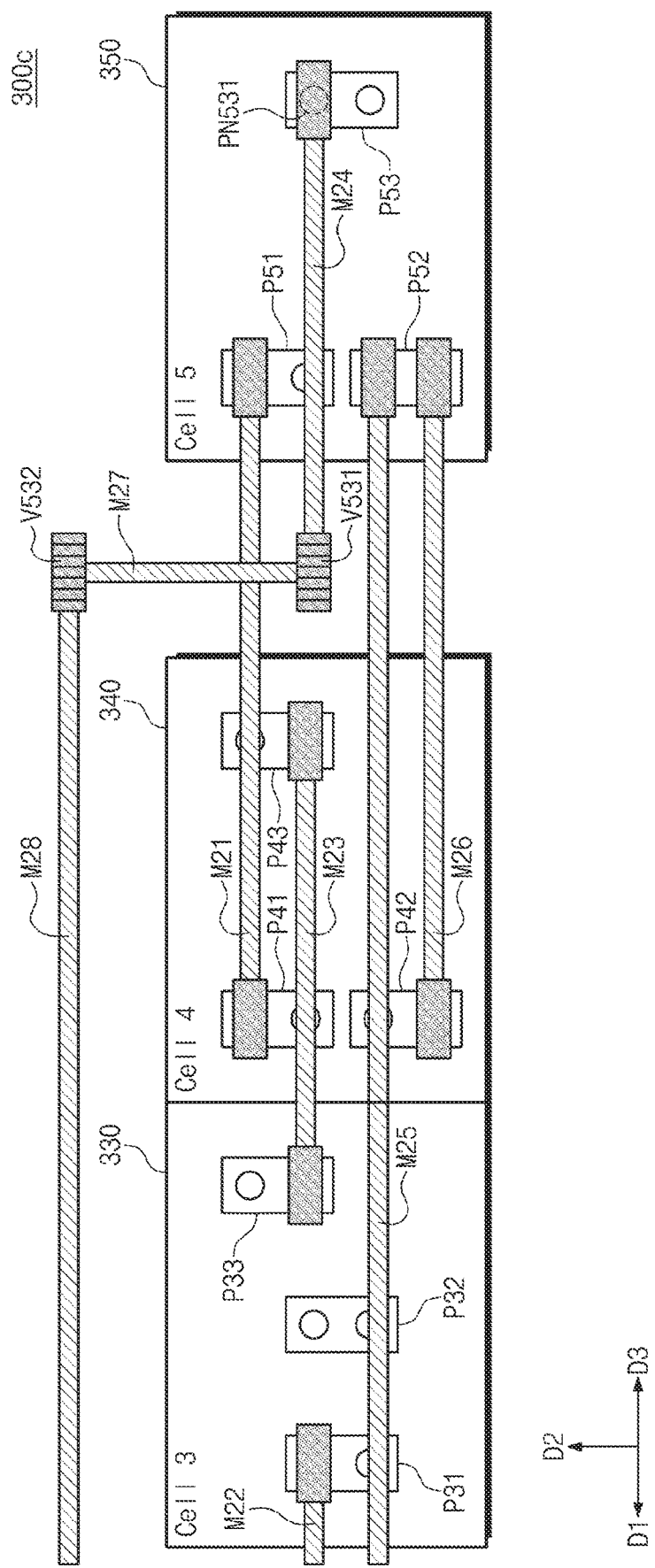
FIG. 11 is a conceptual diagram illustrating example cells routed according to an operation of FIG. 6.

FIG. 11 is a conceptual diagram illustrating example cells routed according to an operation of FIG. 6.

In an example of FIG. 11, the ports P31 to P33, the ports P41 to P43, and the ports P51 to P53 may be routed in the horizontal directions D1 and D3 on a first layer. The ports P31 to P33, the ports P41 to P43, and the ports P51 to P53 may be routed in the vertical direction D2 on a second layer. Vias V531 and V532 may connect a metal line of the first layer and a metal line of the second layer.

Below, in the specification, the via may be a component for connecting components included in respective different layers. For example, the via may connect metal lines included in respective different layers. In the specification, that a via is routed may mean that a via is connected with any other via or a port by a metal line or the like, depending on a command of a user.

Referring to FIG. 11, the port P53 may be routed in the direction D1 by a metal line M24, a metal line M27, a metal line M28, the via V531, and the via V532. In detail, in the first layer, the port P53 may be routed with the via V531 by the metal line M24 through the pin PN531. The metal line M24 in the first layer may be connected with the metal line M27 in the second layer by the via V531. In the second layer, the via V531 may be routed with the via V532 by the metal line M27. The metal line M27 in the second layer may be connected with the metal line M28 in the first layer by the via V532. In the first layer, the port V532 may be routed in the direction D1 by the metal line M28.

The ports P31 and P33, the ports P41 to P43, and the ports P51 and P52 may be routed by metal lines through corresponding pins. For example, the port P41 may be routed with the port P51 by a metal line M21. The port P31 may be routed in the direction D1 by a metal line M22. The port P33 may be routed with the port P43 by a metal line M23. The port P52 may be routed in the direction D1 by a metal line M25. The port P52 may be routed with the port P42 by a metal line M26.

As described with reference to FIG. 10, the cost function value of the fourth cell 340 in the placement 300c may be smaller than the cost function value of the fourth cell 340 in the placement 300a. In the placement 300a of FIG. 7, the port P53 cannot be routed in the direction D1. However, in the placement 300c of FIG. 11, the port P53 may be routed in the direction D1. Accordingly, the routability of the placement 300c may be higher than the routability of the placement 300a.

In the operation of inserting the space 342 in operation S2300 of FIG. 6, the cost function value may be associated with the routability of the placements 300a and 300c. In detail, with regard to the operation of inserting the space 342, as the cost function value decreases, the routability may increase.

The example method for inserting a space between the fourth cell 340 and the fifth cell 350 for the purpose of increasing the routability is described above with reference to FIGS. 10 and 11. However, the inventive concepts are not limited thereto. For example, the inventive concepts may include all embodiments for inserting a space at any location for the purpose of increasing the routability.

Figure 12:
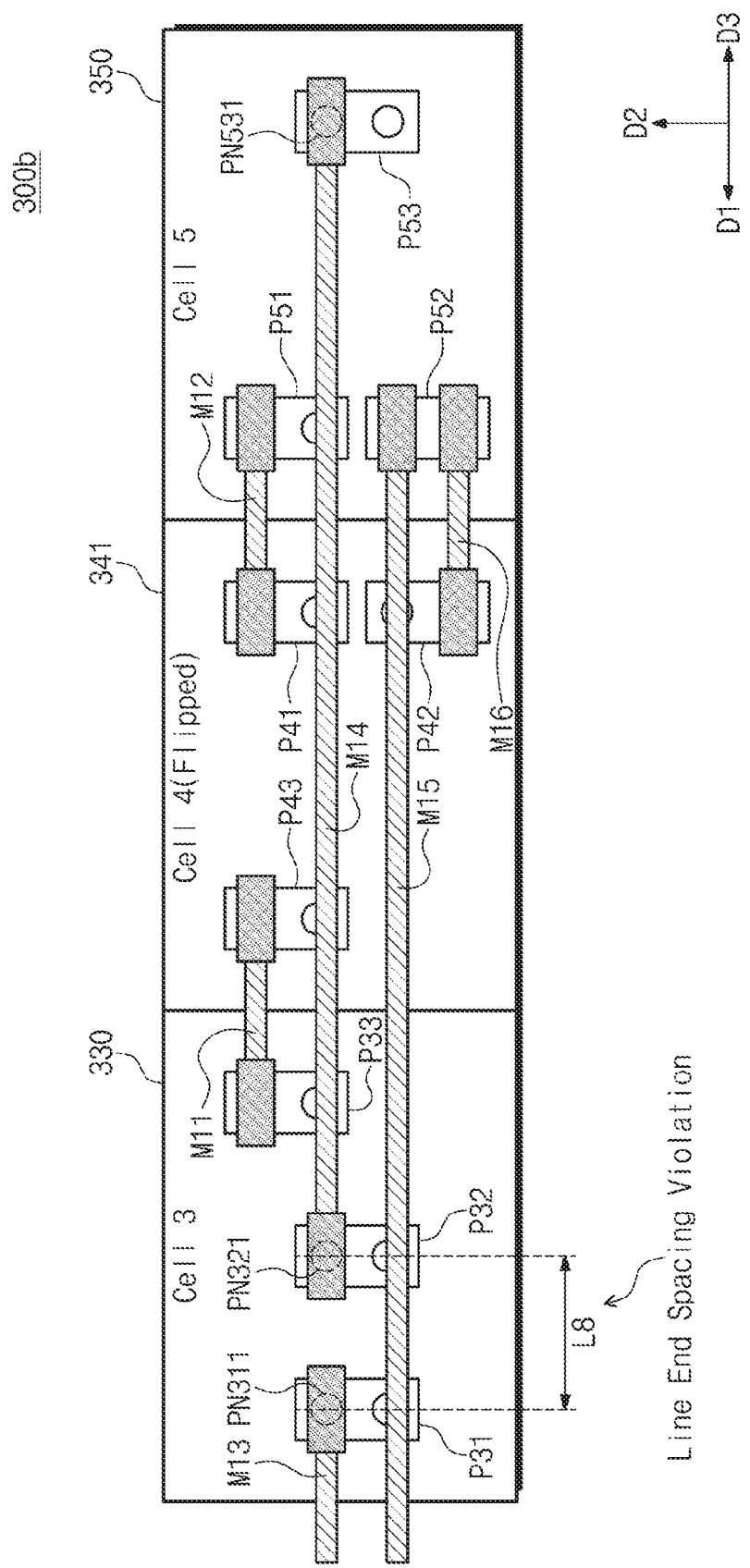
FIG. 12 is a conceptual diagram illustrating example cells routed according to an operation of FIG. 6.

FIG. 12 is a conceptual diagram illustrating example cells routed according to an operation of FIG. 6. In an example of FIG. 12, the ports P31 to P33, the ports P41 to P43, and the ports P51 to P53 may be routed in the horizontal directions D1 and D3 on a first layer.

Referring to FIG. 12, the port P33 may be routed with the port P43 by the metal line M11. The port P41 may be routed with the port P51 by the metal line M12. The port P31 may be routed in the direction D1 through the pin PN311, by the metal line M13. The port P32 may be routed with the port P53 through the pin PN321 and the pin PN531, by a metal line M14.

In the example of FIG. 12, a line end spacing violation may occur between the port P31 and the port P32. The line end spacing violation which is one of design rule check violations may occur in the case where a distance between ports in the horizontal directions D1 and D3 is shorter than a reference distance. In the case where the distance between ports in the horizontal directions D1 and D3 is shorter than the reference distance, when a semiconductor chip is fabricated in operation S2400 of FIG. 6, a process margin cannot be sufficiently secured.

Accordingly, to secure a sufficient process margin, the distance between ports in the horizontal directions D1 and D3 may be longer than the reference distance. For example, "L8" which is a distance between the pin PN311 and the pin PN321 may correspond to a distance between the port P31 and the port P32 in the horizontal directions D1 and D3. "L8" may be shorter than the reference distance. Accordingly, a line end spacing violation may occur between the port P31 and the port P32.

Figure 13:
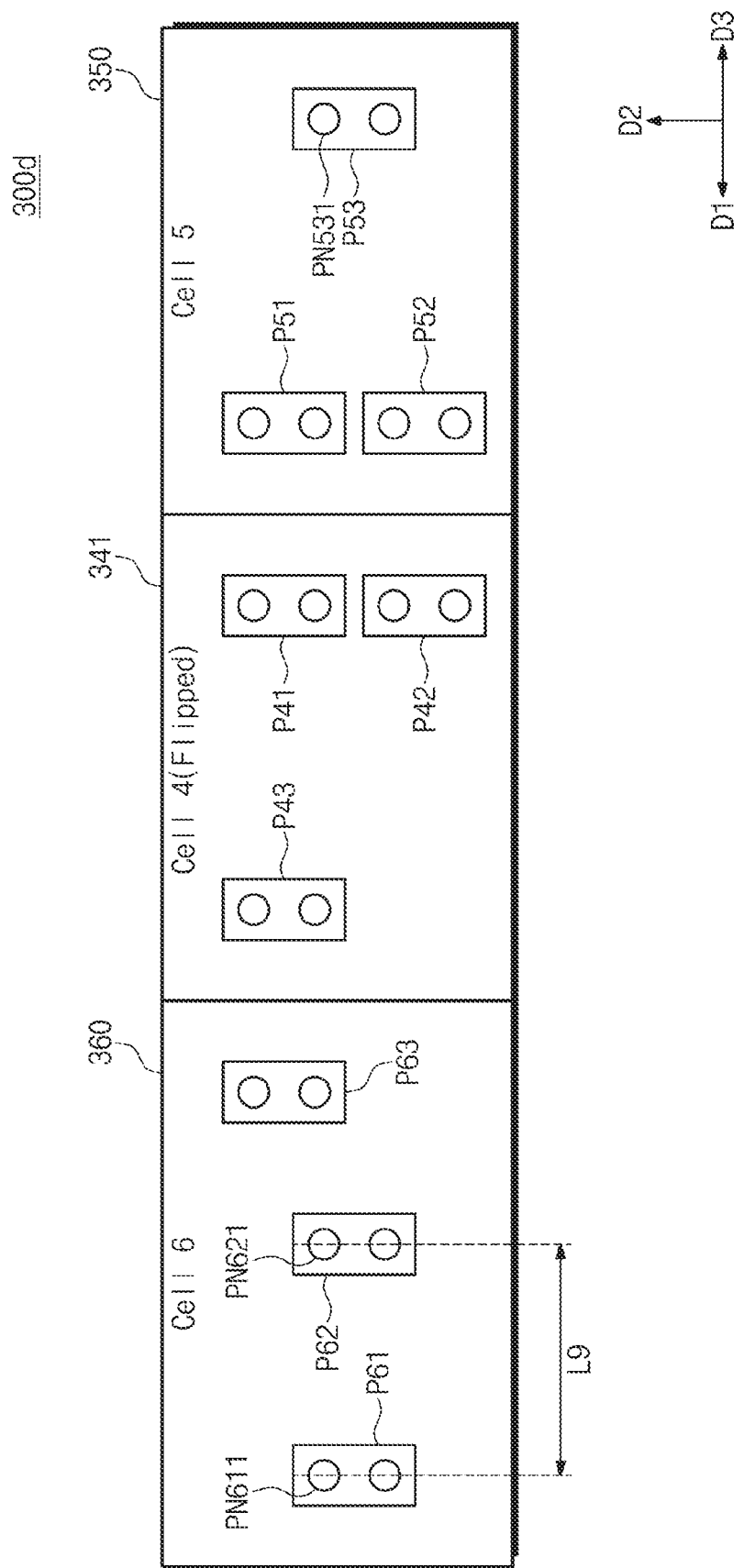
FIG. 13 is a conceptual diagram illustrating example cells placed according to an operation of FIG. 6.

FIG. 13 is a conceptual diagram illustrating example cells placed according to an operation of FIG. 6.

A placement 300d of FIG. 13 may include a sixth cell 360, instead of the third cell 330 of the placement 300b of FIG. 12. The sixth cell 360 may include a port P61, a port P62, and a port P63. The port P61 may include a pin PN611, and the port P62 may include a pin PN621. The port P61 may correspond to the port P31, the port P62 may correspond to the port P32, and the port P63 may correspond to the port P33.

A distance between the pin PN611 and the pin PN621 may be "L9". "L9" of FIG. 13 may be longer than "L8" of FIG. 12. Accordingly, a distance between the port P61 and the port P62 of the sixth cell 360 may be longer than a distance between the port P31 and the port P32, which respectively correspond to the port P61 and the port P62, of the third cell 330. The sixth cell 360 of FIG. 13 may be placed in the area wider than the third cell 330 of FIG. 12. In operation S2300 of FIG. 6, the third cell 330 of FIG. 12 may be replaced with the sixth cell 360 of FIG. 13.

Figure 14:
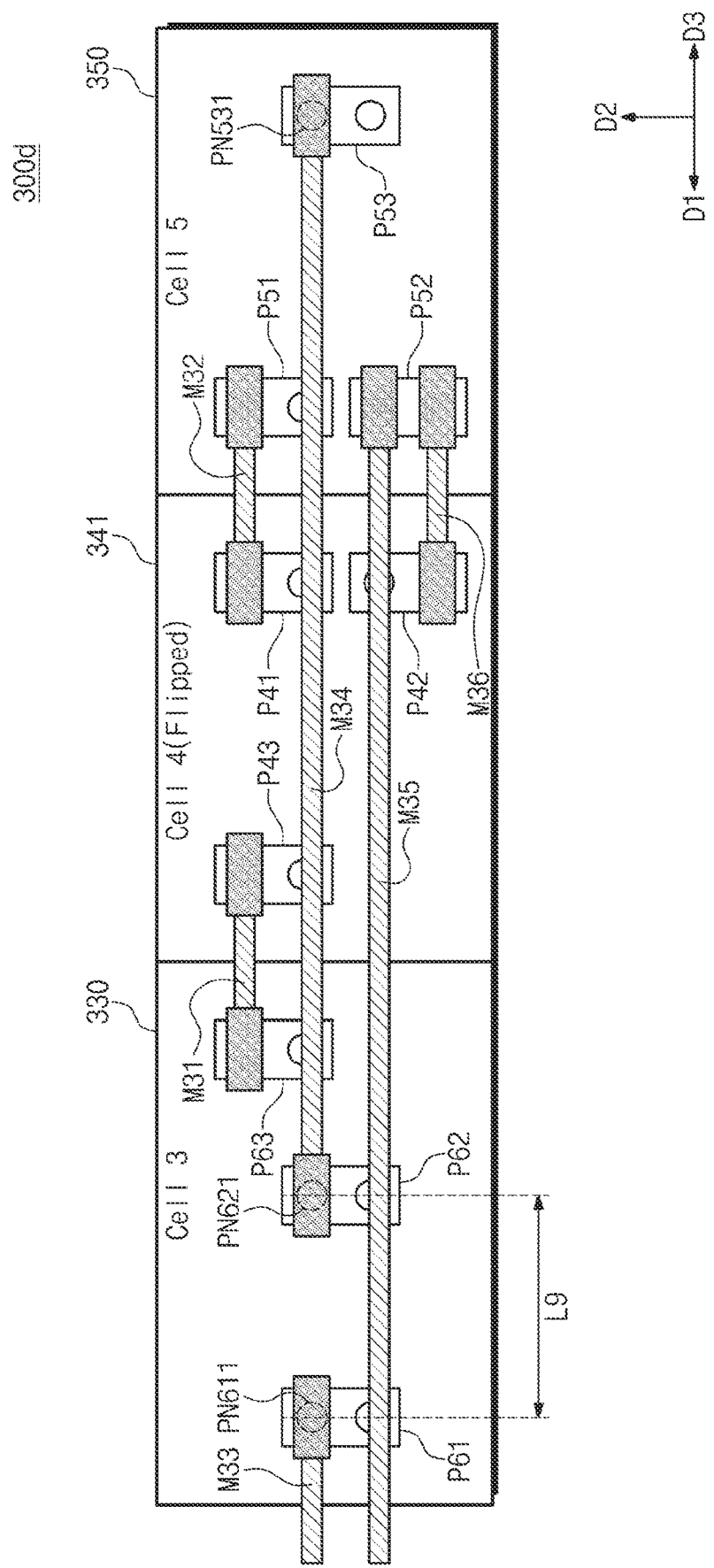
FIG. 14 is a conceptual diagram illustrating example cells routed according to an operation of FIG. 6.

FIG. 14 is a conceptual diagram illustrating example cells routed according to an operation of FIG. 6. In an example of FIG. 14, the ports P61 to P63, the ports P41 to P43, and the ports P51 to P53 may be routed in the horizontal directions D1 and D3 on one layer.

Referring to FIG. 14, the port P63 may be routed with the port P43 by a metal line M31. The port P41 may be routed with the port P51 by a metal line M32. The port P61 may be routed in the direction D1 through the pin PN611, by a metal line M33. The port P62 may be routed with the port P53 through the pin PN621 and the pin PN531, by a metal line M34.

A distance between the port P61 and the port P62 may correspond to "L9" which is a distance between the pin PN611 and the pin P621. "P9" may be longer than a reference distance associated with occurrence of the line end spacing violation. Accordingly, the line end spacing violation may not occur between the port P61 and the port P62.

The line end spacing violation may occur in the placement 300b of FIG. 12, but the line end spacing violation may not occur in the placement 300d of FIGS. 13 and 14. Accordingly, the routability of the placement 300d may be higher than the routability of the placement 300b.

Figure 15:
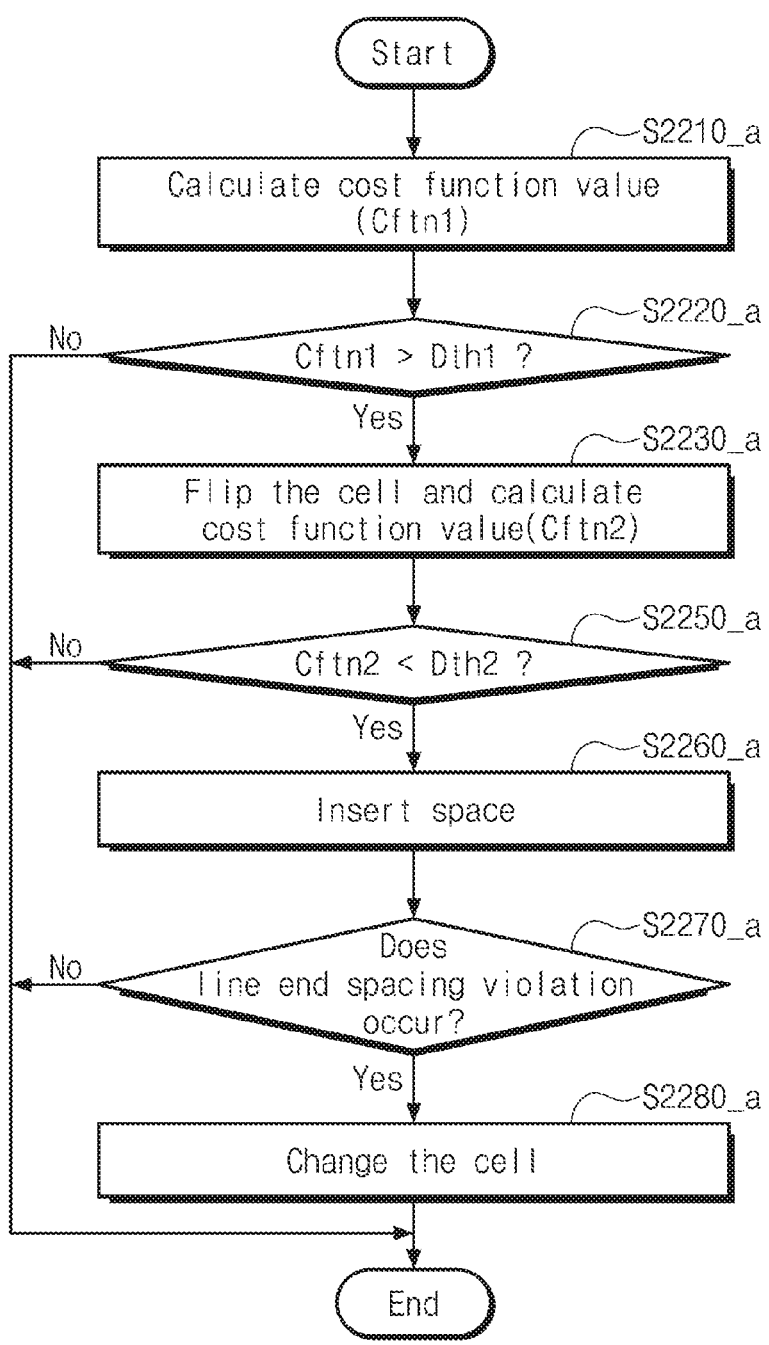
FIG. 15 is a flowchart illustrating an example method for performing operation S2300 of FIG. 6.

FIG. 15 is a flowchart illustrating an example method for performing operation S2300 of FIG. 6. Below, an example method for performing operation S2300 of FIG. 6 will be described with reference to FIGS. 2 and 15.

Referring to FIGS. 6 and 15, before operation S2210_a, the user 10 may input a command through an input device of the user interface 150. The electronic device 100 may receive the command from the user 10 through the user interface 150. As described with reference to FIG. 3, the electronic device 100 may obtain information for designing a semiconductor chip from the command of the user 10. For example, the electronic device 100 may obtain information about the placement of cells. For example, the electronic device 100 may obtain information about the routing of the cells from the command of the user 10.

In operation 2210_a, the electronic device 100 may calculate a cost function value Cftn1 depending on a cost function of at least one of Equation 1 and Equation 2. Below, the cost function value Cftn1 calculated according to the cost function of Equation 1, will be described with reference to FIG. 15. A detailed method for obtaining the cost function value is described with reference to FIG. 7. Thus, additional description will be omitted to avoid redundancy.

In operation S2220_a, the electronic device 100 may compare the cost function value Cftn1 calculated in operation S2210_a with a first reference value Dth1. The electronic device 100 may obtain the first reference value Dth1 based on the command received from the user 10 through the input device of the user interface 150. The memory 120 of FIG. 1 may store the first reference value Dth1 obtained.

For example, the user 10 may appropriately set the first reference value Dth1 in consideration of the routability. In the case where a cost function value of a specific placement is not greater than the first reference value Dth1, the user 10 may determine that the specific placement has a sufficient routability based on experience. In the case where the cost function value Cftn1 is not greater than the first reference value Dth1, an operation may be terminated. In the case where the cost function value Cftn1 is greater than the first reference value Dth1, operation S2230_a may be performed.

In operation S2230_a, the electronic device 100 may flip a cell placed in operation S2100 of FIG. 6. An example method for flipping a cell is described with reference to FIG. 8. Thus, additional description will be omitted to avoid redundancy. The electronic device 100 may calculate a cost function value Cftn2 with respect to the cell having the placement changed by the flipping. The cost function value Cftn2 may be greater than the cost function value Cftn1.

In operation S2250_a, the electronic device 100 may compare the cost function value Cftn2 calculated in operation S2230_a with a second reference value Dth2. The electronic device 100 may obtain the second reference value Dth2 based on the command received from the user 10 through the input device of the user interface 150. The memory 120 of FIG. 1 may store the second reference value Dth2 obtained.

For example, the user 10 may appropriately set the second reference value Dth2 in consideration of the routability. In the case where a cost function value of a specific placement is not smaller than the second reference value Dth2, the user 10 may determine that the specific placement has a sufficient routability based on experience.

In the case where the cost function value Cftn2 is not smaller than the second reference value Dth2, an operation may be terminated. As described with reference to FIGS. 8 and 9, with regard to the flipping operation, as a cost function value increases, the routability may increase. In the case where the cost function value Cftn2 is smaller than the second reference value Dth2, operation S2260_a may be performed.

In operation S2260_a, the electronic device 100 may insert a space between cells of the placement changed in operation S2230_a. An example method for inserting a space is described with reference to FIG. 10. Thus, additional description will be omitted to avoid redundancy.

In operation S2270_a, the electronic device 100 may determine whether a line end spacing violation occurs in the placement changed in operation S2260_a. In the case where the line end spacing violation does not occur, an operation may be terminated. In the case where the line end spacing violation occurs, operation S2280_a may be performed.

In operation S2280_a, the electronic device 100 may replace a cell of the placement changed in operation S2260_a with any other cell. For example, in the case where a first cell is replaced with a second cell, a distance between ports included in the second cell may be longer than a distance between ports which are included in the first cell and respectively correspond to ports included in the second cell. An example method for replacing a cell is described with reference to FIG. 10. Thus, additional description will be omitted to avoid redundancy.

Operation S2230_a and operation S2250_a, operation S2260_a and operation S2270_a, and S2280_a are illustrated in FIG. 15 as being sequentially performed. However, the inventive concepts may include all embodiments in which operation S2230_a and operation S2250_a, operation S2260_a and operation S2270_a, and S2280_a are performed in any order. That is, a flipping operation, an operation of inserting a space between cells, and an operation of replacing a cell may be performed according to any order.

An example in which operation S2220_a to operation S2280_a are all performed is illustrated in FIG. 15. However, the inventive concepts may include all embodiments including at least one of the operation of flipping a cell (operation S2220_a and operation S2250_a), the operation of inserting a space between cells (operation S2260_a and operation S2270_a), and the operation of replacing a cell with any other cell (operation S2280_a).

An example in which a cost function value is increased by the flipping operation in operation S2230 is described above. Below, an example in which a cost function value is decreased by the flipping operation will be described with reference to FIGS. 16 and 17.

Figure 16:
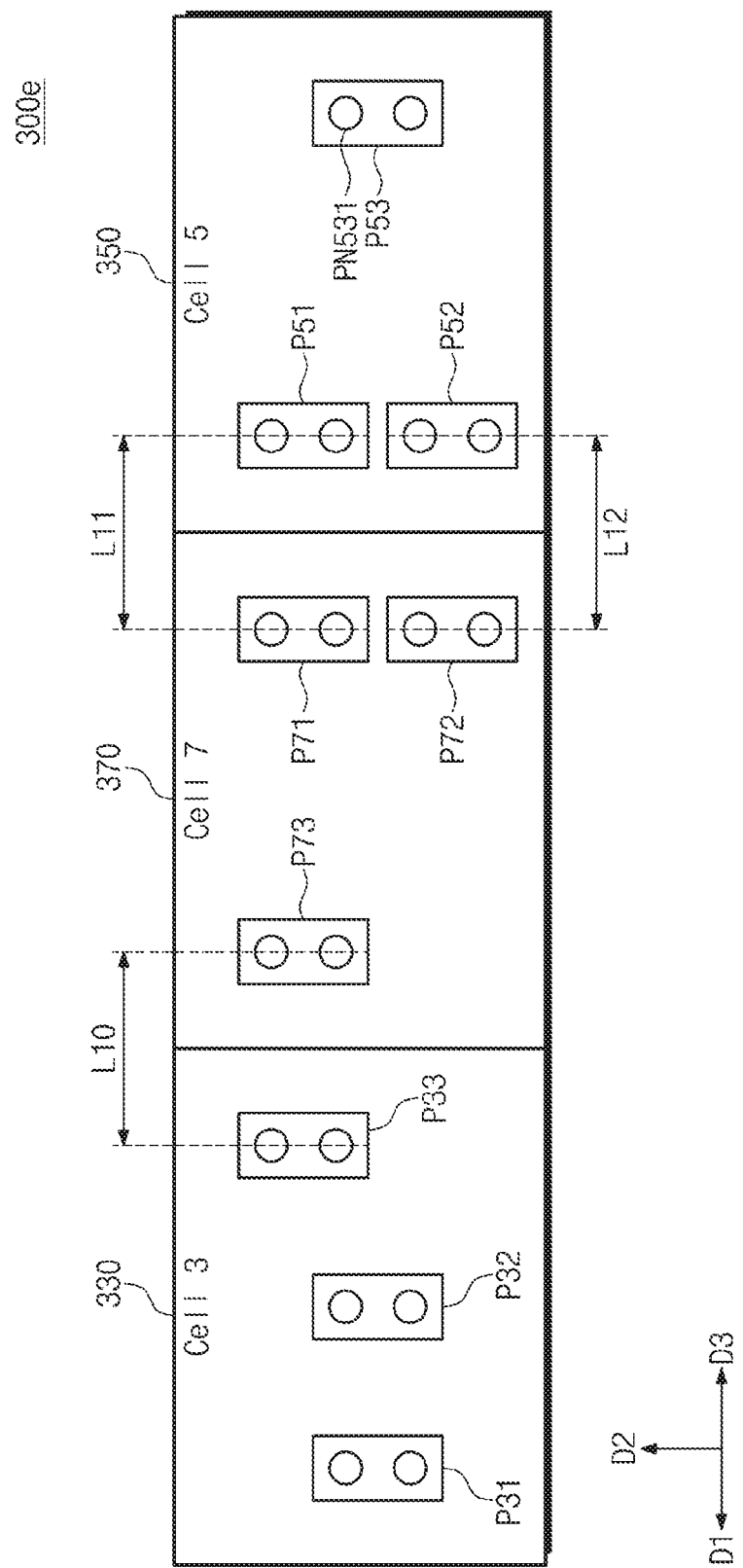
FIG. 16 is a conceptual diagram illustrating example cells placed according to an operation of FIG. 6.

FIG. 16 is a conceptual diagram illustrating example cells placed according to an operation of FIG. 6.

A placement 300e of FIG. 16 may include a seventh cell 370, instead of the flipped fourth cell 341 of the placement 300b of FIG. 8. A configuration of the seventh cell 370 is similar to a configuration of the flipped fourth cell 341. Thus, additional description will be omitted to avoid redundancy. Ports P71 to P73 of the seventh cell 370 may correspond to the ports P41 to P43 of the flipped fourth cell 341, respectively. The distances L4 to L6 between pins in the placement 300*b* of FIG. 8 may correspond to distances L10 to L12 between pins in the placement 300*e* of FIG. 16. Accordingly, a cost function value of the seventh cell 370 calculated by the electronic device 100 may be "1/L10+1/L11+1/L12".

Figure 17:
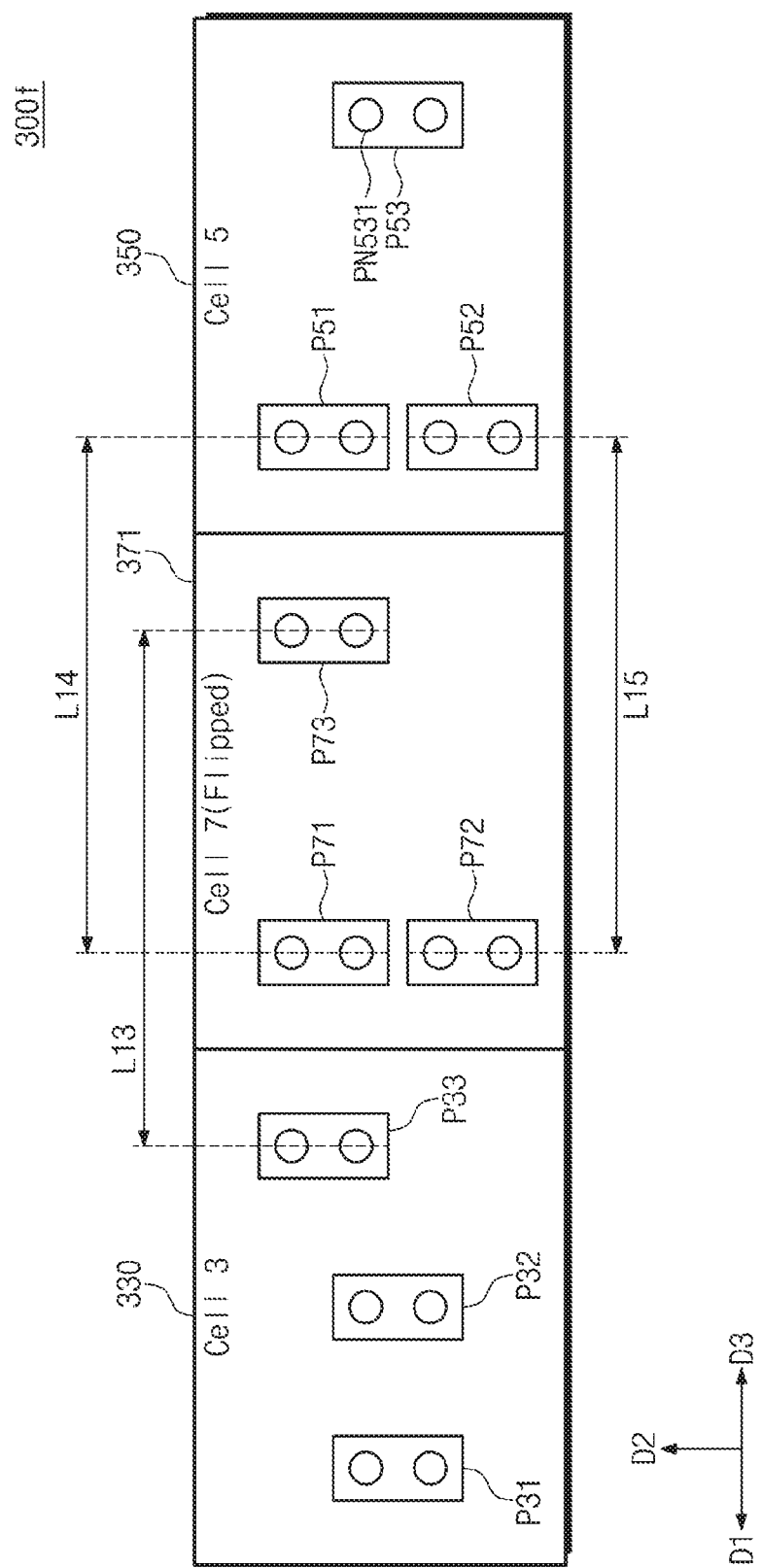
FIG. 17 is a conceptual diagram illustrating example cells placed according to an operation of FIG. 6.

FIG. 17 is a conceptual diagram illustrating example cells placed according to an operation of FIG. 6.

In operation S2200 of FIG. 6, the electronic device 100 may flip the seventh cell 370 of FIG. 17. Accordingly, the ports P71 to P73 of a flipped seventh cell 371 may correspond to the ports P71 to P73 of the seventh cell 370 of FIG. 16, respectively.

A placement 300*f* of FIG. 17 may include the flipped seventh cell 371, instead of the fourth cell 340 of the placement 300*a* of FIG. 7. A configuration of the flipped seventh cell 371 is similar to a configuration of the fourth cell 340. Thus, additional description will be omitted to avoid redundancy. The ports P71 to P73 of the flipped seventh cell 371 may correspond to the ports P41 to P43 of the fourth cell 340, respectively. The distances L1 to L3 between pins in the placement 300*a* of FIG. 7 may correspond to distances L13 to L15 between pins in the placement 300*f* of FIG. 17. Accordingly, a cost function value of the flipped seventh cell 371 calculated by the electronic device 100 may be "1/L13+1/L14+1/L15".

Referring to FIGS. 16 and 17, "L13" may be longer than "L10", "L14" may be longer than "L11", and "L15" may be longer than "L12". Accordingly, the cost function value of the flipped seventh cell 371 may be smaller than the cost function value of the seventh cell 370. As described with reference to FIG. 9, with regard to an operation of flipping a specific cell, as a cost function value decreases, the routability may decrease. Accordingly, the routability may decrease in the process of flipping the seventh cell 370. That is, the routability of the placement 300*f* may be lower than the routability of the placement 300*e*.

Figure 18:
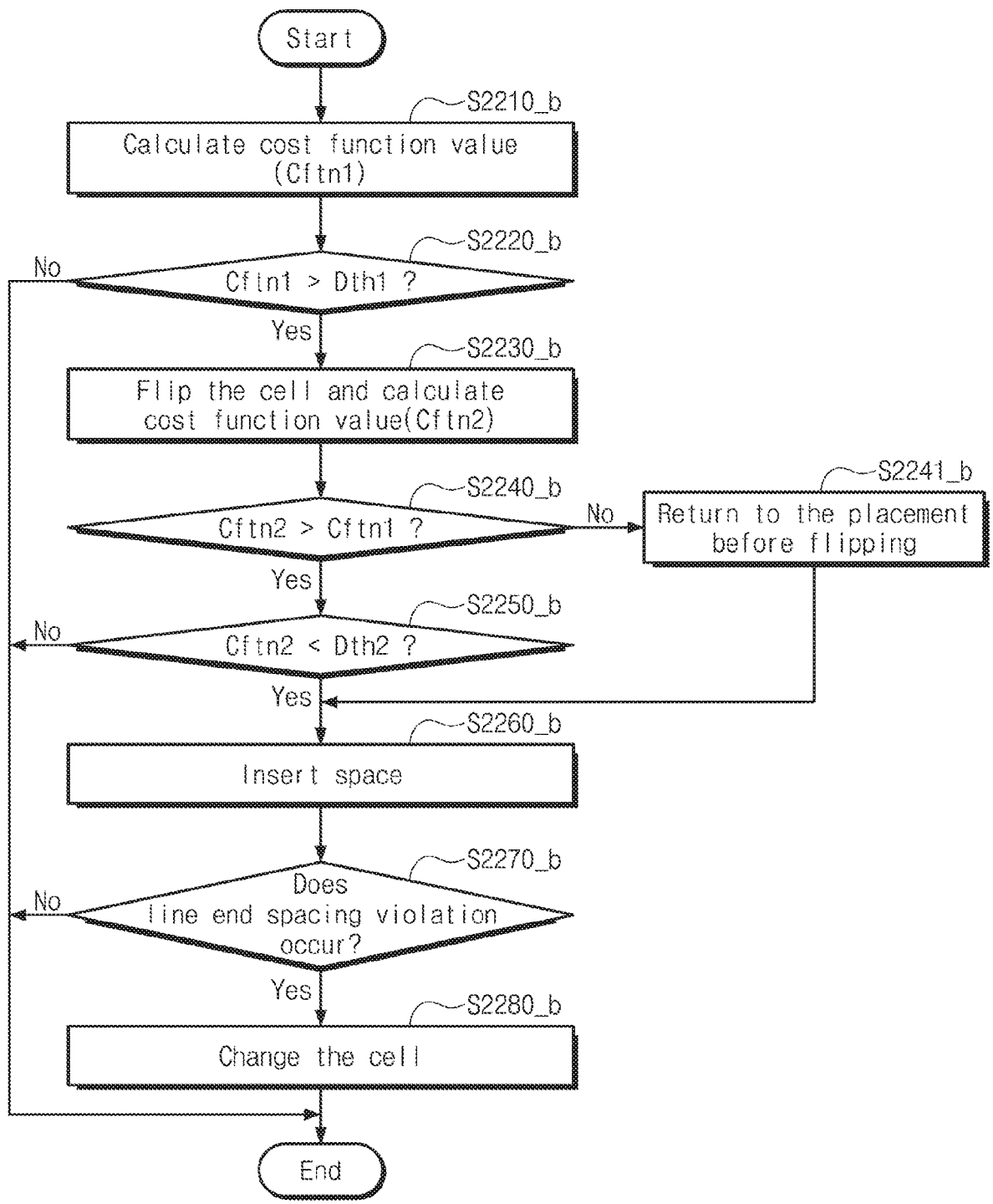
FIG. 18 is a flowchart illustrating an example method for performing operation S2300 of FIG. 6.

FIG. 18 is a flowchart illustrating an example method for performing operation S2300 of FIG. 6.

Operation S2210_*b* to operation S2230_*b*, and operation S2250_*b* to S2280_*b* of FIG. 18 may be similar to operation S2210_*a* to operation S2230_*a*, and operation S2250_*a* to operation S2280_*a* of FIG. 15. Accordingly, a description associated with operation S2210_*b* to operation S2230_*b*, and operation S2250_*b* to S2280_*b* will be omitted below.

In operation S2240_*b*, the electronic device 100 may compare the cost function value Cftn2 with the cost function value Cftn1. As described with reference to FIG. 9, with regard to an operation of flipping a specific cell, as a cost function value increases, the routability may increase.

Accordingly, in the case where the cost function value Cftn2 is greater than the cost function value Cftn1, the routability may increase. Accordingly, in the case where the cost function value Cftn2 is greater than the cost function value Cftn1, operation S2250_*b* may be performed. In the case where the cost function value Cftn2 is not greater than the cost function value Cftn1, the routability may decrease or may be identical. In the case where the cost function value Cftn2 is not greater than the cost function value Cftn1, operation S2241_*b* may be performed.

In operation S2241_*b*, the electronic device 100 may return the placement of the cell flipped in operation S2230_*b* to a placement before the flipping operation. That is, operation S2241_*b* may be performed to prevent the routability from being decreased by the flipping operation.

Operation S2260_*b* may be performed after operation S2241_*b* is performed.

Figure 19:
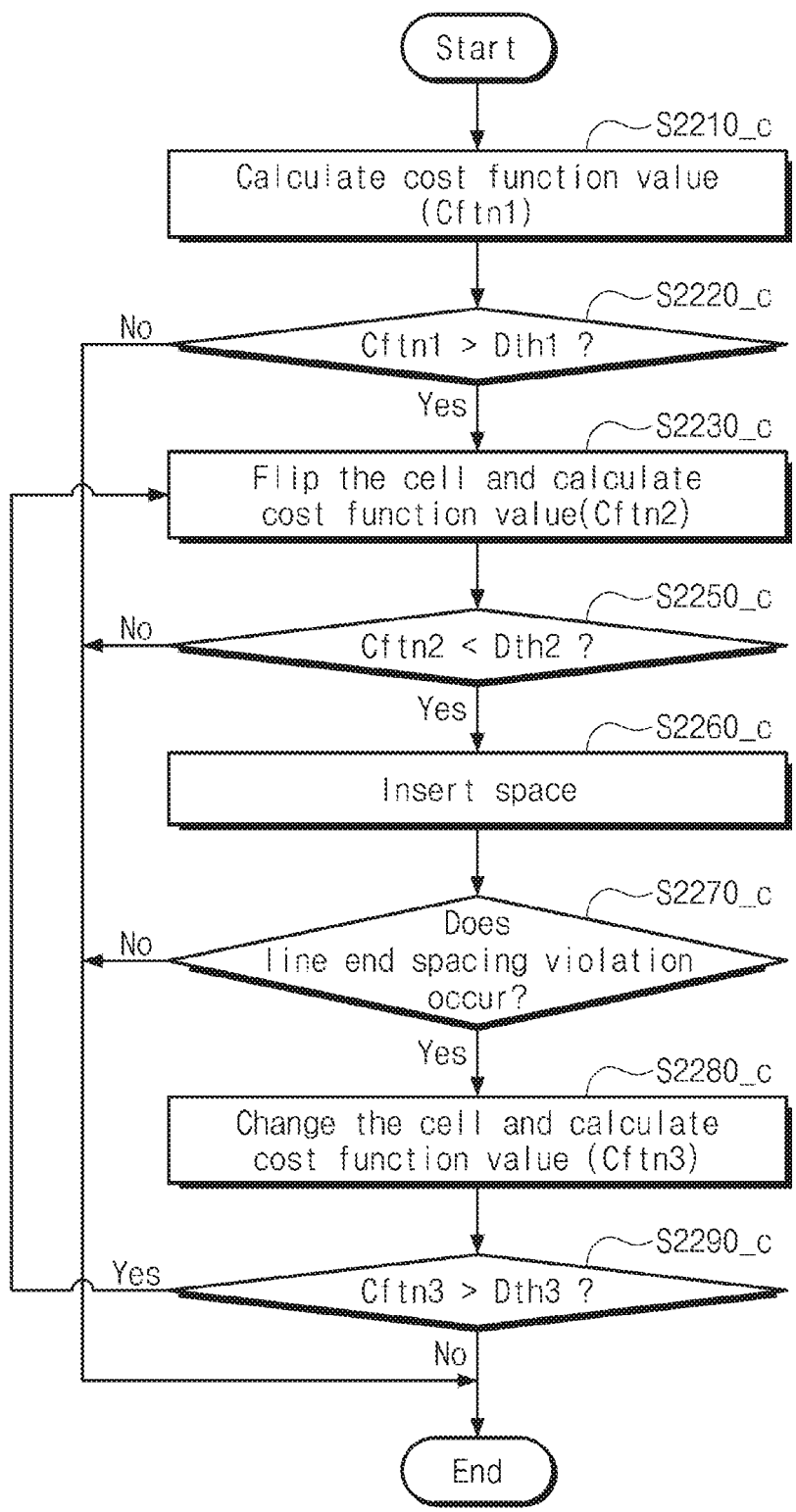
FIG. 19 is a flowchart illustrating an example method for performing operation S2300 of FIG. 6.

FIG. 19 is a flowchart illustrating an example method for performing operation S2300 of FIG. 6.

Operation S2210_*c* to operation S2230_*c*, and operation S2250_*c* to S2270_*c* of FIG. 19 may be similar to operation S2210_*a* to operation S2230_*a*, and operation S2250_*a* to operation S2270_*a* of FIG. 15. Accordingly, a description associated with operation S2210_*c* to operation S2230_*c*, and operation S2250_*c* to S2270_*c* will be omitted below.

In operation S2280_*c*, a cell placed in operation S2210_*c* to operation S2260_*c* may be replaced with any other cell. An example method for replacing a cell is described with reference to FIG. 10. Thus, additional description will be omitted to avoid redundancy. The electronic device 100 may calculate a cost function value Cftn3 with respect to the replaced cell. The cost function value Cftn3 may be smaller than the cost function value Cftn2 and the cost function value Cftn1.

In operation S2290_*c*, the electronic device 100 may compare the cost function value Cftn3 calculated in operation S2280_*c* with a third reference value Dth3. The third reference value Dth3 may be input through an input device of the user interface 150, by the user 10. The memory 120 of FIG. 1 may store the third reference value Dth3 input.

For example, the user 10 may appropriately set the third reference value Dth3 in consideration of the routability. In the case where a cost function value of a specific placement is not greater than the third reference value Dth3, the user 10 may determine that the specific placement has a sufficient routability based on experience. Accordingly, in the case where the cost function value Cftn3 is not greater than the third reference value Dth3, an operation may be terminated.

In the case where the cost function value Cftn3 is greater than the third reference value Dth3, operation S2230_*c* may be performed again. In the case where the cost function value Cftn3 is greater than the third reference value Dth3 set by the user 10 even though a specific cell is replaced through operation S2280_*c*, the routability of the placement including the specific cell may be lower than the routability intended by the user 10. Accordingly, operations S2230_*c* to operation S2290_*c* may be repeated.

An embodiment in which operation S2230_*c* to operation S2290_*c* are repeated after operation S2290_*c* is illustrated in FIG. 19. However, the inventive concepts may include all embodiments including at least one of the operation of flipping a cell (operation S2230_*c* and operation S2250_*c*), the operation of inserting a space between cells (operation S2260_*c* and operation S2270_*c*), and the operation of replacing a cell with any other cell (S2280_*c* and operation S2290_*c*).

According to example embodiments of the inventive concepts, a placement of a routing-possible cell may be efficiently obtained by changing a placement of a cell before routing the cell upon designing a semiconductor chip.

According to one or more example embodiments, the units and/or devices described above, such as the components of the electronic device 100 including the processor 110, and components of the semiconductor manufacturing device 1000, may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. An electronic device configured to fabricate a semiconductor chip, the electronic device comprising:
   a processor configured to,
      place a first target cell associated with designing the semiconductor chip;
      selectively flip the first target cell to reverse a placement of the first target cell to generate a reversed placement based on a first cost function value of the placement of the first target cell and a first reference value;
      selectively return the reversed placement of the first target cell based on a second cost function value of the reversed placement of the first target cell and the first cost function value;
      selectively insert a space between the first target cell and a cell adjacent to the first target cell based on one of the first cost function value and the second cost function value, and a second reference value; and
      selectively replace the first target cell with a second target cell associated with designing the semiconductor chip based on an occurrence of a line end spacing violation; and
   an input device configured to receive an input of the first reference value and the second reference value.

2. The electronic device of claim 1, wherein the processor is configured to route a first port of the first target cell and a second port of another cell associated with designing the semiconductor chip.

3. The electronic device of claim 2, wherein the processor is configured to calculate the first cost function value based on a distance between the first port and the second port, and wherein
the first cost function value decreases as the distance increases.

4. The electronic device of claim 2, wherein the processor is configured to calculate the first cost function value based on a number of pins included in the first port, and wherein
the first cost function value decreases as the number of the pins becomes increases.

5. The electronic device of claim 1, wherein a distance between first ports included in the first target cell is less than or equal to a distance between second ports included in the second target cell that respectively correspond to the first ports.

6. A method of fabricating a semiconductor chip, the method comprising:
placing, by a processor, a target cell based on a first placement, the target cell being associated with designing the semiconductor chip, the target cell having a first port to be routed to a second port of another cell;
selectively changing, by the processor, the first placement to a second placement, based on a cost function value of the target cell in the first placement and a reference value, the cost function value being based on one of (i) a distance between the first port and the second port and (ii) at least a number of pins in the target cell;
selectively changing, by the processor, the second placement to a third placement based on an occurrence of a line end spacing violation; and
fabricating the semiconductor chip based on one of the first placement, the second placement, and the third placement.

7. The method of claim 6, wherein the selectively changing the first placement to the second placement includes:
changing, by the processor, the first placement to the second placement in response to the cost function value being less than the reference value.

8. The method of claim 7, wherein the selectively changing the first placement to the second placement further includes:
inserting, by the processor, a space between the target cell and a cell adjacent to the target cell to change the first placement to the second placement.

9. The method of claim 6, wherein the selectively changing the first placement to the second placement includes:
changing, by the processor, the first placement to the second placement in response to the cost function value being greater than the reference value.

10. The method of claim 9, wherein the selectively changing the first placement to the second placement further includes:
flipping, by the processor, the target cell to change the first placement to the second placement by reversing a placement of the target cell.

11. The method of claim 10, further comprising:
selectively returning the second placement to the first placement, based on the cost function value of the target cell in the first placement and a cost function value of the target cell in the second placement.

12. The method of claim 6, wherein the selectively changing the second placement to the third placement further includes:
replacing the target cell with a replacement cell associated with designing the semiconductor chip to change the second placement to the third placement.

13. The method of claim 12, wherein a distance between first ports in the target cell is less than or equal to a distance between second ports included in the replacement cell that respectively correspond to the first ports.

14. The method of claim 6, further comprising:
routing the target cell with the another cell associated with designing the semiconductor chip based on one of the first placement, the second placement, and the third placement.

15. The method of claim 14, further comprising:
calculating the cost function value based on the distance between the first port of the target cell and the second port of the another cell.

16. The method of claim 14, further comprising:
calculating the cost function value, based on a difference between the number of pins included in the target cell and a number of pins used to route the target cell and the another cell among the pins.

17. The method of claim 6, further comprising:
repeating the selectively changing of the first placement to the second placement and the selectively changing of the second placement to the third placement in response to the cost function value of the target cell in the second placement being greater than the reference value.

18. A method of fabricating a semiconductor chip, the method comprising:
placing, by a processor, a target cell associated with designing the semiconductor chip;
selectively flipping, by the processor, the target cell to reverse a placement of the target cell based on a first cost function value of the target cell and a first reference value;
selectively inserting, by the processor, a space between the target cell and a cell adjacent to the target cell based on a second cost function value of the target cell and a second reference value;
selectively replacing, by the processor, the target cell with another cell, based on an occurrence of a line end spacing violation;
repeating, by the processor, at least one of the selectively flipping, the selectively inserting, and the selectively replacing based on a third cost function value of the target cell and a third reference value; and
fabricating the semiconductor chip based on the target cell.

19. The method of claim 18, further comprising:
routing a first port of the target cell with a second port of the cell adjacent to the target cell; and
calculating the first cost function value based on a number of pins located on a routing path connecting a pin of the first port and a pin of the second port.

20. The method of claim 18, further comprising:
routing a first port of the target cell with a second port of the cell adjacent to the target cell; and
calculating the first cost function value based on a distance between the first port and the second port.

* * * * *